(12) United States Patent
Tsutsue

(10) Patent No.: US 7,417,304 B2
(45) Date of Patent: Aug. 26, 2008

(54) ELECTRONIC DEVICE AND METHOD FOR FABRICATING THE SAME

(75) Inventor: Makoto Tsutsue, Shiga (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 11/223,943

(22) Filed: Sep. 13, 2005

(65) Prior Publication Data

US 2006/0076651 A1 Apr. 13, 2006

(30) Foreign Application Priority Data

Sep. 24, 2004 (JP) .............................. 2004-277087

(51) Int. Cl.
*H01L 23/544* (2006.01)
(52) U.S. Cl. .............................. 257/620; 257/E21.523
(58) Field of Classification Search ................ 257/734, 257/620, E23.18, E23.181; 438/113, 458, 438/462
See application file for complete search history.

(56) References Cited

U.S. PATENT DOCUMENTS 6,022,791 A * 2/2000 Cook et al. ................. 438/458
6,365,958 B1 * 4/2002 Ibnabdeljalil et al. ........ 257/620
6,498,089 B2 * 12/2002 Komada ...................... 438/618
6,943,063 B2 * 9/2005 Tsai et al. .................... 438/118
2003/0160261 A1 * 8/2003 Moriya ........................ 257/127
2004/0084777 A1 * 5/2004 Yamanoue et al. ........... 257/758
2005/0269702 A1 * 12/2005 Otsuka ......................... 257/750
2006/0055005 A1 * 3/2006 Furusawa et al. ............ 257/635

FOREIGN PATENT DOCUMENTS

JP 2001-023937 A 1/2001

\* cited by examiner

*Primary Examiner*—Evan Pert
*Assistant Examiner*—Ben P Sandvik
(74) *Attorney, Agent, or Firm*—McDermott Will & Emery LLP

(57) ABSTRACT

An electronic device has an element formed in the chip region of a substrate, a plurality of interlayer insulating films formed on the substrate, a wire formed in the interlayer insulating films in the chip region, and a plug formed in the interlayer insulating films in the chip region and connecting to the wire. A seal ring extending through the plurality of interlayer insulating films and continuously surrounding the chip region is formed in the peripheral portion of the chip region. A stress absorbing wall extending through the plurality of interlayer insulating films and discretely surrounding the seal ring is formed outside the seal ring.

11 Claims, 32 Drawing Sheets

ELECTRONIC DEVICE AND METHOD FOR FABRICATING THE SAME

CROSS-REFERENCE TO RELATED APPLICATIONS

The teachings of Japanese Patent Application No. 2004-277087, filed Sep. 24, 2004, are entirely incorporated herein by reference, inclusive of the specification, drawings, and claims.

BACKGROUND OF THE INVENTION

The present invention relates to an electronic device having a seal ring formed to surround a chip region and a mechanism for protecting the seal ring and to a method for fabricating the same.

An electronic device such as a semiconductor device is typically formed by arranging a large number of IC circuits each composed of a plurality of elements and having a specified function as a matrix on a semiconductor wafer made of, e.g., silicon or the like.

A large number of chip regions arranged in the wafer are separated from each other by scribe regions (scribe lines) provided in a grid-like configuration. After the large number of chip regions are formed in a single wafer through a semiconductor fabrication process, the wafer is diced into individual chips along the scribe regions so that semiconductor devices are formed.

When the wafer is diced to be separated into the individual chips, however, the portions of the chip regions which are adjacent to the scribe lines receive mechanical impact, which may cause local cracks or chippings in the cross sections of the individual chips, i.e., semiconductor devices into which the wafer has been separated.

As a solution to the problem, Japanese Laid-Open Patent Publication No. 2001-23937 proposes a technology which provides a seal ring as a ring-shaped protective wall around each of the chip regions to prevent the propagation of a crack in the chip region during dicing.

FIG. 32 shows a cross-sectional structure of a conventional semiconductor device (that has been embedded in a wafer) having a seal ring.

As shown in FIG. 32, a seal ring 4 extending through the multilayer structure and continuously surrounding the chip region 2 is formed in the portion of the multilayer structure consisting of the plurality of interlayer insulating films 5 to 10 which is located in the peripheral portion of the chip region 2. The seal ring 4 is formed by alternately using a mask for wire formation and a mask for via formation, as shown in, e.g., Japanese Laid-Open Patent Publication No. 2001-23937. Specifically, the seal ring 4 is composed of: a conductive layer 30 formed in the substrate 1, a seal via 31 formed in the interlayer insulating film 5 and connecting to the conductive layer 30; a seal wire 32 formed in the interlayer insulating film 6 and connecting to the seal via 31; a seal via 33 formed in the interlayer insulating film 7 and connecting to the seal wire 32; a seal wire 34 formed in the interlayer insulating film 8 and connecting to the seal via 33; a seal via 35 formed in the interlayer insulating film 9 and connecting to the seal wire 34; and a seal wire 36 formed in the interlayer insulating film 10 and connecting to the seal via 35. In the present application, the portions of the seal ring formed by using the mask for wire formation will be termed seal wires and the portions of the seal ring formed by using the mask for via formation will be termed seal vias.

As also shown in FIG. 32, a passivation film 11 is further provided over the multilayer structure consisting of the plurality of interlayer insulating films 5 to 10 and provided with the wires (22, 24, and 26) and with the vias (21, 23, and 25). The passivation film 11 has an opening formed over the wire 26 and a pad 27 connecting to the wire 26 is formed in the opening.

SUMMARY OF THE INVENTION

In the conventional semiconductor device, however, even though a crack or impact that has occurred during the dicing of a wafer can be prevented from propagating toward the inner portion of the chip region by using the seal ring, a crack or flaw occurs in a part of the seal ring. Accordingly, the seal ring cannot sufficiently exert the function of preventing the ingression of moisture, movable ions, and the like into the region surrounded by the seal ring, which is one of the intrinsic functions of the seal ring.

Since the seal ring has been provided continuously in the peripheral portion of the chip region, there are cases where the portion of the seal ring that has been destroyed through the absorption of the crack or impact may be left protruding from the end portion of one of individual semiconductor devices (semiconductor chips) into which the wafer has been separated by dicing. When packaging is performed with respect to the semiconductor device in such a condition, the residue of the seal ring comes into contact with a bonding wire and causes a defective product.

To prevent an increase in wire-to-wire capacitance resulting from the miniaturization of a semiconductor device and a wire connecting thereto, i.e., a reduction in the processing speed of the semiconductor device, a technology which prevents the increase in wire-to-wire capacitance by using an interlayer insulating film with a low dielectric constant has been developed.

However, since the interlayer insulating film with a low dielectric constant is typically low in mechanical strength, the resistance of the interlayer insulating film with a low dielectric constant to a stress occurring during dicing is less sufficient than the resistance of a material that has been used conventionally for an interlayer insulating film. Accordingly, the interlayer insulating film with a low dielectric constant is more susceptible to damage during dicing. As a result, it has been becoming increasingly difficult to perform both of the function of preventing the propagation of a crack or the like that has occurred during dicing and the function of preventing the ingression of moisture, movable ions, and the like into the chip region from the outside thereof by using only a seal ring, as has been performed conventionally.

In view of the foregoing, it is therefore an object of the present invention to prevent a crack, a flaw, or the like that has occurred in the side surface of each of chips during the division of a wafer into the individual chips (semiconductor devices) by dicing from reaching a seal ring and causing the destruction thereof in order to prevent further propagation of the crack, flaw, or the like into the chip region and thereby prevent the degradation of the moisture resistance and reliability of an electronic device.

To attain the object, the electronic device according to the present invention comprises: an element formed in a chip region of a substrate; a multilayer structure composed of a plurality of interlayer insulating films formed on the substrate; a wire formed in at least one of the plurality of interlayer insulating films in the chip region; a plug formed in at least one of the plurality of interlayer insulating films in the chip region and providing a connection between the element and the wire or between the individual wires; a seal ring formed in a portion of the multilayer structure composed of the plurality of interlayer insulating films which is located in a peripheral portion of the chip region to extend through the multilayer structure and continuously surround the chip region; and a stress absorbing wall formed in a portion of the multilayer structure composed of the plurality of interlayer insulating film which is located outside the seal ring to extend through the multilayer structure and discretely surround the seal ring.

In the electronic device according to the present invention, the stress absorbing wall is formed to surround the seal ring so that a crack, stress, or the like that has occurred during the dicing of a wafer is blocked by the stress absorbing wall before reaching the seal ring. This eliminates a situation where the seal ring is cracked or destroyed and thereby prevents the impairment of the function of reliably protecting the inner portion of the chip region, which is one of the intrinsic functions of the seal ring.

In the electronic device according to the present invention, the stress absorbing wall discretely surrounds the seal ring, i.e., the individual components of the stress absorbing wall are arranged discretely and independently of each other along a direction in which the seal ring extends. Even though any of the individual components is damaged and destroyed by the crack or the like during the dicing of the wafer, there is no such situation that the destruction of the stress absorbing wall is enlarged along the direction in which the seal ring extends. That is, since the individual components of the stress absorbing wall are independent of each other, it becomes possible to prevent a component adjacent to a destroyed component from coming off as a result of being pulled thereby. By reducing the size of each of the components of the stress absorbing wall, it also becomes possible to prevent a situation where the damaged component is left protruding from the end portion of one of individual semiconductor devices (semiconductor chips) into which the wafer has been separated by dicing. In other words, the damaged component is sufficiently small in size so that it comes off from the chip relatively easily In the electronic device according to the present invention, the stress absorbing walls in a double or higher-order multiple structure are preferably surrounding the seal ring.

In the arrangement, even though the crack, impact, or the like that has occurred during dicing is not absorbed completely by that one of the stress absorbing walls provided in a multiple structure which is at a position closest to the diced portion (the portion of the scribe region which is actually cut by the blade of a dicing system) of the wafer and propagates toward the inner portion of the chip region, at least one other stress absorbing wall that has been formed internally of that one of the stress absorbing wall closest to the diced portion can prevent further propagation of the crack, impact, or the like toward the inner portion of the chip region. As a result, the crack, impact, or the like that has occurred during dicing is blocked before reaching the seal ring so that the seal ring is not cracked nor destroyed. Accordingly, the function of reliably protecting the inner portion of the chip region, which is performed by the seal ring, is not impaired.

When the stress absorbing walls in a double or higher-order multiple structure are surrounding the seal ring, gap portions between respective discrete portions of each of the stress absorbing walls in the double or higher-order multiple structure are preferably not aligned in rows.

In the arrangement, even though the crack, impact, or the like that has occurred during dicing is not blocked by that one of the stress absorbing walls provided in a multiple structure which is at the position closest to the diced portion of the wafer and propagates toward the inner portion of the chip region by passing through the discrete portions of the stress absorbing walls (the portions of the stress absorbing walls which are located between the individual components thereof), the crack, impact, or the like that has not been blocked by the stress absorbing wall closest to the diced portion of the wafer is blocked by another stress absorbing wall located internally thereof because the gap portions of the stress absorbing wall closest to the diced portion of the wafer and those of the stress absorbing wall located internally thereof are not aligned in rows in a direction perpendicular toe the direction in which the seal ring extends. In other words, the respective portions composing the individual stress absorbing walls in a multiple structure are arranged with no space therebetween to form a whole entity when the chip region is viewed from the diced portion of the wafer. The arrangement allows reliable prevention of the propagation of the crack, impact, or the like from the diced portion of the wafer toward the inner portion of the chip region. As a result, the crack, impact, or the like that has occurred during dicing can be blocked before reaching the seal ring so that the seal ring is not cracked nor destroyed. Accordingly, the function of reliably protecting the inside of the chip region, which is performed by the seal ring, is not impaired.

When the stress absorbing walls in a double or higher-order multiple structure are surrounding the seal ring, each of components of the one of the stress absorbing walls in the double or higher-order multiple structure which is formed at a position most distant from the seal ring preferably has a shorter length along a direction in which the seal ring extends than each of components of the other stress absorbing wall or walls.

In the arrangement, even though the crack, impact, or the like that has occurred during dicing is not completely absorbed by that one of the stress absorbing walls provided in a multiple structure which is at the position closest to the diced portion of the wafer and propagates toward the inner portion of the chip region, at least one other stress absorbing wall that has been formed internally of the stress absorbing wall closest to the diced portion of the wafer can prevent further propagation of the crack, impact, or the like toward the inner portion of the chip region. In addition, since each of the components of the stress absorbing wall at the position closest to the diced portion of the wafer, i.e., at the position most distant from the seal ring has shorter length, the crack, impact, or the like that has occurred during dicing can be finely distributed and absorbed. As a result, the ingression of the crack, impact, or the like that has occurred during dicing can be prevented before it reaches the seal ring so that the seal ring is not cracked nor destroyed. Accordingly, the function of reliably protecting the inner portion of the chip region, which is performed by the seal ring, is not impaired. Since each of the components of the stress absorbing wall is smaller in size, even though one of the components receives the crack, impact, or the like during dicing and is destroyed thereby, the component easily comes off from the semiconductor device (one of the individual semiconductor chips into which the wafer has been separated by dicing). This prevents a situation where the destroyed component is left protruding from the end portion of the semiconductor chip after dicing and thereby eliminates a defective product resulting from the contact between the residue of the stress absorbing wall and a bonding wire when packaging is performed with respect to the semiconductor chip.

In the electronic device according to the present invention, each of the seal ring and the stress absorbing wall may also be composed of at least one of W, Al, and Cu.

A method for fabricating an electronic device according to the present invention is a method for fabricating an electronic device comprising an element formed in a chip region of a substrate, a multilayer structure composed of a plurality of interlayer insulating films formed on the substrate, a wire formed in at least one of the plurality of interlayer insulating films in the chip region, a plug formed in at least one of the plurality of interlayer insulating films in the chip region and providing a connection between the element and the wire or between the individual wires, a seal ring formed in a portion of the multilayer structure composed of the plurality of interlayer insulating films which is located in a peripheral portion of the chip region to extend through the multilayer structure and continuously surround the chip region, and a stress absorbing wall formed in a portion of the multilayer structure composed of the plurality of interlayer insulating film which is located outside the seal ring to extend through the multilayer structure and discretely surround the seal ring. Specifically, the method comprises the steps of: forming, in one of the plurality of interlayer insulating films, a first depressed portion to be filled with the plug or the wire, a second depressed portion to be filled with a part of the seal ring, and a third depressed portion to be filled with a part of the stress absorbing wall; filling a conductive film in each of the first, second, and third depressed portions to form the plug or the wire, the part of the seal ring, and the part of the stress absorbing wall; and forming a protective film on the multilayer structure composed of the plurality of interlayer insulating films provided with the wire, the plug, the seal ring, and the stress absorbing wall.

Since the method for fabricating an electronic device according to the present invention is a method for fabricating the electronic device according to the present invention that has been described above, the method can achieve the same effects as achieved by the electronic device according to the present invention that has been described above.

Thus, according to the present invention, the stress absorbing wall is provided to discretely surround the seal ring in the electronic device including the chip region and the seal ring provided in the peripheral portion of the chip region and surrounding elements, a wiring layer, and the like in the chip region. Alternatively, the stress absorbing wall having such a structure may also be stress absorbing walls in a double or higher-order multiple structure which are surrounding the seal ring. In that case, the respective gap portions of the individual stress absorbing walls in a double or higher-order multiple structure are preferably not aligned in rows and/or that one of the stress absorbing walls which is most distant from the seal ring is preferably composed of a plurality of portions smaller in size than the portions of the other stress absorbing wall or walls.

Since the characteristic features of the present invention described above allow a crack, flaw, or the like caused by dicing in the wafer when the individual chips (semiconductor devices) are collected from the wafer to be blocked by the stress absorbing wall or walls in a single, double, or higher-order multiple structure before it reaches the seal ring, the destruction of the seal ring and the resulting destruction of the chip region serving as the semiconductor device can be presented. As a result, it becomes possible to prevent the degradation of the moisture resistance and reliability of the semiconductor chip.

Thus, the present invention relates to an electronic device having a seal ring formed to surround the chip region and a mechanism for protecting the seal ring and is extremely useful since it achieves the effect of allowing the seal ring to retain the function of reliably protecting the inner portion of the chip region by blocking a crack, stress, or the like that has occurred during dicing by using a stress absorbing wall.

DETAILED DESCRIPTION OF THE INVENTION

Figure 1:
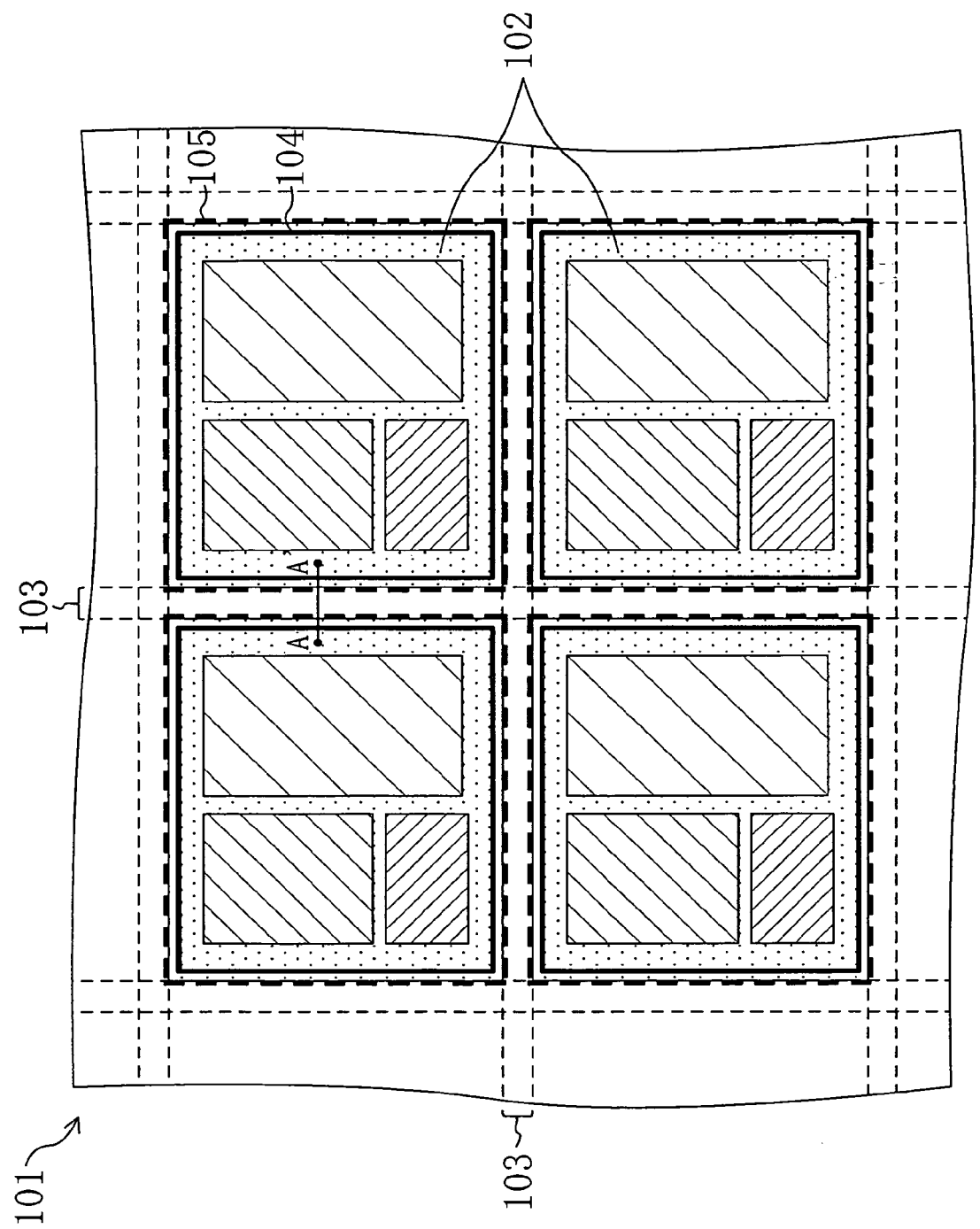
FIG. 1 is a plan view showing a part of a wafer provided with an electronic device according to a first embodiment of the present invention.

Referring now to the drawings, the individual embodiments of the present invention will be described herein below.

A first characteristic feature of the present invention is that each of a seal ring and a stress absorbing wall is formed in the same step in which a wiring structure is formed. In addition, the individual components of the stress absorbing wall are arranged discretely and independently of each other along a direction in which the seal ring extends. Accordingly, even though any of the components is damaged and destroyed by a crack or the like that has occurred during the dicing of a wafer, there is no such situation that the destruction of the stress absorbing wall is enlarged along the direction in which the seal ring extends. Since the individual components of the stress absorbing wall are independent of each other, it becomes possible to prevent a component adjacent to the destroyed one from coming off as a result of being pulled thereby. It also becomes possible to prevent a situation where the damaged component is left protruding from the end portion of one of individual semiconductor devices (semiconductor chips) into which the wafer has been separated by dicing (a first embodiment).

A second characteristic feature of the present invention is that stress absorbing walls in a double or higher-order multiple structure are provided. In the arrangement, even though the crack, impact, or the like cannot be absorbed completely by one of the stress absorbing walls, it can be absorbed by another stress absorbing wall. As a result, it becomes possible to prevent the crack, impact, or the like from reaching the seal ring (a second embodiment).

A third characteristic feature of the present invention is that gap portions between the respective discrete portions of the stress absorbing walls in a double or higher-order multiple structure are not aligned in rows. As a result, the respective portions composing the individual stress absorbing walls in a multiple structure are arranged with no space therebetween to form a whole entity when the chip region is viewed from the diced portion of the wafer. Therefore, compared with the cases where the stress absorbing wall is in a single structure and where the respective gap portions of the individual stress absorbing walls in a double or higher-order multiple structure are aligned in rows (i.e., in the case where the respective plan configurations of the individual stress absorbing walls are analogous), the seal ring and the chip region can be protected more reliably (a third embodiment).

A fourth characteristic feature of the present invention is that the components of that one (the outermost stress absorbing wall) of the stress absorbing walls in a double or higher-order multiple structure which is formed at a position most distant from the seal ring are shorter in length along the direction in which the seal ring extends than the components of the other stress absorbing wall or walls. In the arrangement, the outermost stress absorbing wall allows the crack, impact, or the like that has occurred during dicing to be finely distributed and absorbed so that the propagation thereof is blocked successfully before it reaches the seal ring. As a result, each of the seal ring and the chip region can be protected. Since the components of the outermost stress absorbing wall are small in size, even though any of the components receives the crack, impact, or the like during dicing and is destroyed thereby, the component easily comes off from the semiconductor device (one of the individual semiconductor chips into which the wafer has been separated by dicing). This makes it possible to prevent a situation where the destroyed component is left protruding from the end portion of the semiconductor chip after dicing and eliminate a defective product resulting from the contact between the residue of the stress absorbing wall and a bonding wire when packaging is performed with respect to the semiconductor chip (a fourth embodiment).

Embodiment 1

An electronic device according to a first embodiment of the present invention and a method for fabricating the same will be described with reference to the drawings.

FIG. 1 is a plan view showing a part of a wafer provided with an electronic device (a semiconductor device having a seal ring singly surrounding a chip region) according to the first embodiment.

As shown in FIG. 1, a plurality of chip regions 102, each of which is to serve as a semiconductor device, are arranged in a wafer 101 serving as a semiconductor substrate represented by, e.g., a silicon substrate or the like. Each of the chip regions 102 is provided with an IC (integrated circuit) composed of a plurality of elements and having a specified function. The individual chip regions 102 are defined by scribe regions 103 provided in a grid-like configuration.

Each one of the semiconductor devices (i.e., each one of the semiconductor chips) is comprised herein of: a chip region 102 in which the IC circuit composed of the plurality of elements and having the specified function; a seal ring 104 provided in the peripheral portion of the chip region 102 to surround the chip region 102; and a stress absorbing wall 105 according to the present invention which is provided outside the seal ring 104 to discretely surround the seal ring 104; The wafer 101 thus formed with the plurality of semiconductor devices is diced along the scribe regions 103 after the completion of the individual chips so that it is separated into the individual semiconductor devices.

Figure 2:
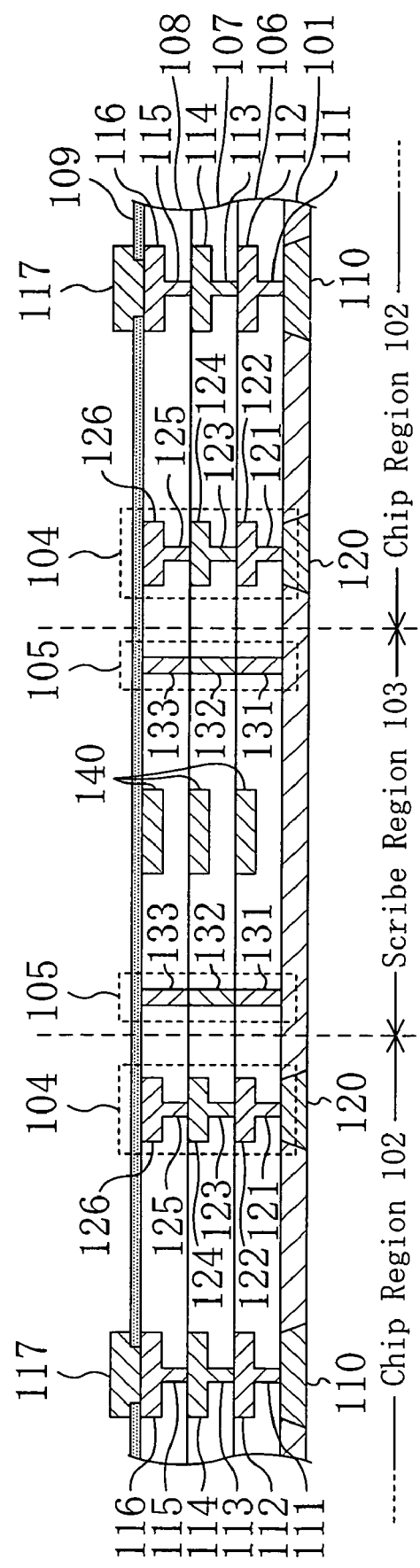
FIG. 2 is a cross-sectional view taken along the line A-A' of FIG. 1.
Figure 3:
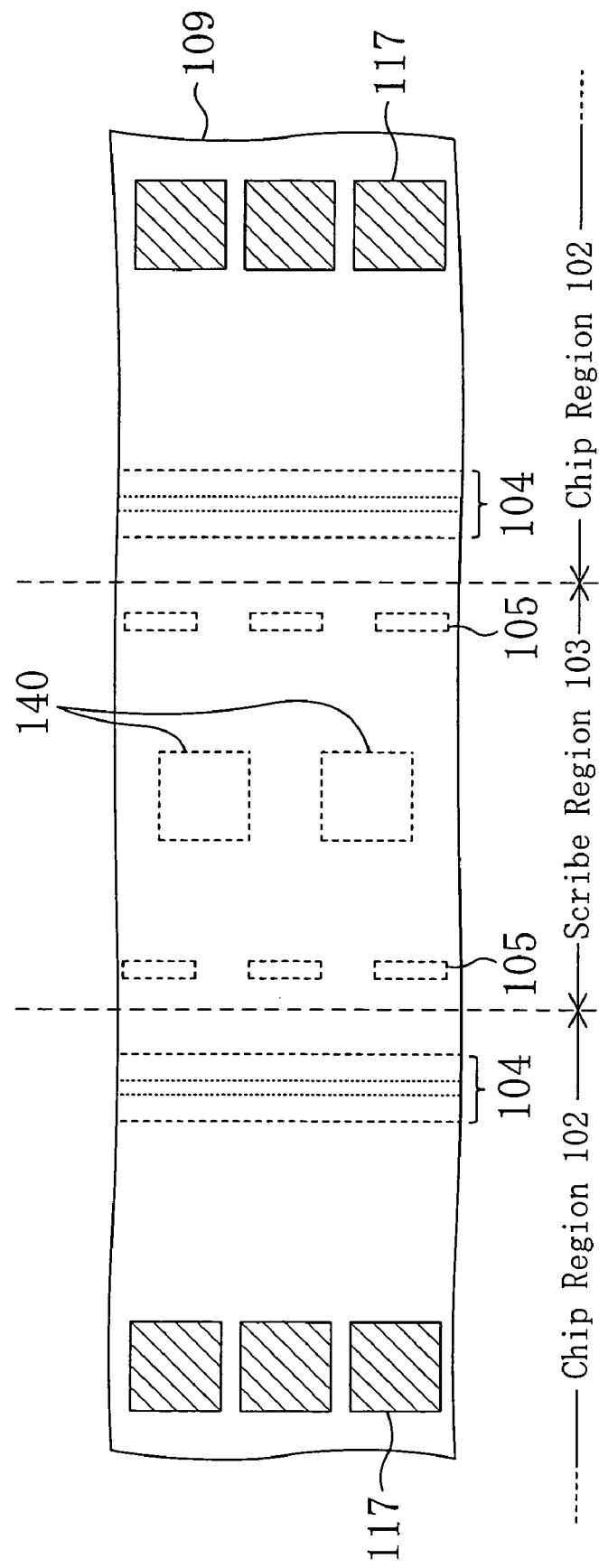
FIG. 3 is a plan view obtained by enlarging the vicinity of the line A-A' of FIG. 1.

FIG. 2 is a cross-sectional view (cross-sectional view of the end portions of the semiconductor devices including seal ring portions positioned in the peripheral portions of the chip regions 102 and, more specifically, of wiring structures in the chip regions 102 and the structures of the seal rings 104) taken along the line A-A' of FIG. 1. FIG. 3 is a plan view obtained by enlarging the vicinity of the line A-A' of FIG. 1. Each of FIGS. 2 and 3 shows the respective end portions of the pair of chip regions 102 with the scribe region 103 interposed therebetween.

As shown in FIGS. 2 and 3, each of the semiconductor devices prior to dicing is composed of the chip region 102 and the scribe region 103. The seal ring 104 is formed in the portion of the chip region 102 which is adjacent to the boundary with the scribe region 103, while the stress absorbing wall 105 is formed outside the seal ring 104 (in the portion of the scribe region 103 which is adjacent to the boundary with the chip region 102).

A description will be given herein below to the method for fabricating the semiconductor device having the structure shown in FIGS. 2 and 3 with reference to FIGS. 4, 5, 6, and 7.

Figure 4:
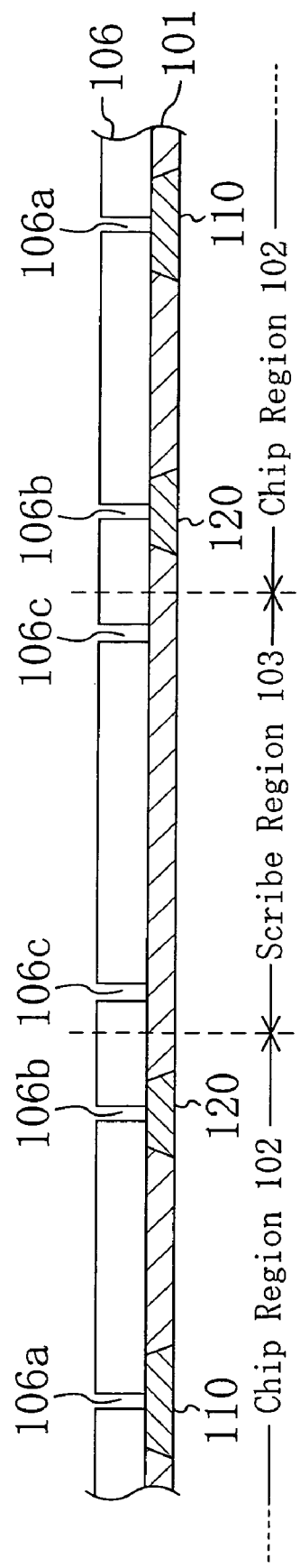
FIG. 4 is a cross-sectional view illustrating the individual process steps of a method for fabricating an electronic device according to the first embodiment.

First, as shown in FIG. 4, active layers 110 composing elements such as a transistor are formed in the chip regions 102 of the wafer 101 (hereinafter referred to as the substrate 101), while conductive layers 120 similarly constituted to the active layers 110 are formed in the peripheral portions (the regions to be formed with the seal rings which are adjacent to the scribe region 103) of the chip regions 102 of the substrate 101.

Next, a first interlayer insulating film 106 is deposited on the substrate 101. Then, via holes 106a for forming first vias 111 (see FIG. 6) are formed in the portions of the first interlayer insulating film 106 located in the individual chip regions 102 by using a lithographic technology and a dry etching technology, while trench-like depressed portions 106b for forming first seal vias 121 (see FIG. 6) are formed in the portions of the first interlayer insulating film 106 located in seal ring formation regions. At the same time, a plurality of depressed portions 106c for forming first buffer vias 131 (see FIG. 6) are formed in the portions of the first interlayer insulating film 106 located in stress absorbing wall formation regions (the portions of the scribe region 103 which are adjacent to the chip regions 102). The seal vias are parts composing the seal rings and are formed by filling a conductive material in the trench-like depressed portions continuously surrounding the chip regions. Accordingly, each of the seal vias has a linear structure having a width substantially equal to the width of each of the vias in the chip regions (see FIG. 3). The buffer vias are parts composing the stress absorbing walls and are formed by filling a conductive material in the plurality of depressed portions discretely surrounding the seal rings. Accordingly, the buffer vias are composed of a plurality of linear components each having a width substantially equal to the width of each of the vias in the chip region.

Although the present embodiment has simultaneously formed the trench-like depressed portions 106b for forming the first seal vias 121 and the depressed portions 106c for forming the first buffer vias 131 in forming the via holes 106a in the portions of the first interlayer insulating film 106 located in the chip regions 102, it will easily be appreciated that the via holes 106a, the trench-like depressed portions 106b, and the depressed portions 106c may be formed individually or, alternatively, any two of these depressed portions may be formed simultaneously.

Figure 5:
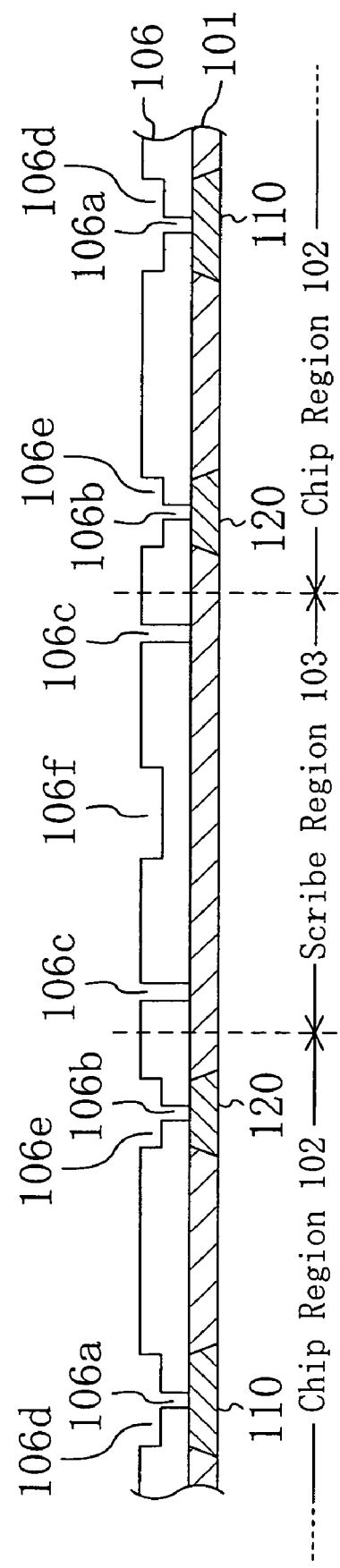
FIG. 5 is a cross-sectional view illustrating the individual process steps of the method for fabricating the electronic device according to the first embodiment.

Next, as shown in FIG. 5, by using a lithographic technology and a dry etching technology, wire trenches 106d for forming first wires 112 (see FIG. 6) are formed in the portions of the first interlayer insulating film 106 located in the chip regions 102 in such a manner as to connect to the via holes 106a, while wire trenches 106e for forming first seal wires 121 (see FIG. 6) are formed in the portions of the first interlayer insulating film 106 located in the seal ring formation regions in such a manner as to connect to the trench-like depressed portions 106b. In addition, a wire trench 106f for forming an accessory wire 140, which serves as an alignment mark for lithography or the like, may also be formed simultaneously in the portion of the first interlayer insulating film 106 located in the scribe region 103.

Figure 6:
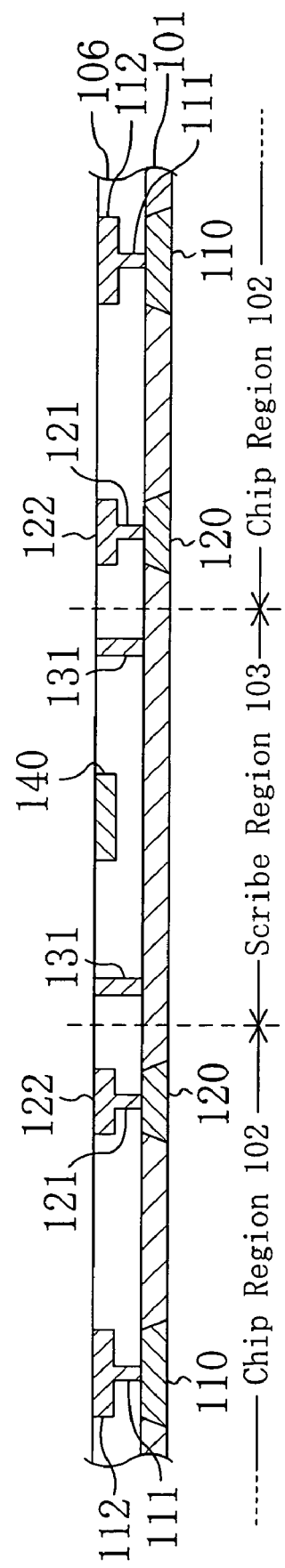
FIG. 6 is a cross-sectional view illustrating the individual process steps of the method for fabricating the electronic device according to the first embodiment.

Next, as shown in FIG. 6, a conductive film made of, e.g., Cu is filled by using, e.g., an electric plating technology, in each of the via holes 106a, the trench-like depressed portions 106b, the depressed portions 106c, and the wire trenches 106d, 106e, and 106f. After that, the portion of the conductive film protruding from the depressed portions 106c and the wire trenches 106d, 106e, and 106f (the portion of the conductive film which is located above the first interlayer insulating film 106) is removed by, e.g., CMP (chemical mechanical polishing). As a result, the first vias 111 connecting to the active layers 110 and the first wires 112 connecting to the first vias 111 (i.e., dual damascene wires composed of the first vias 111 and the first wires 112) are formed in the portions of the first interlayer insulating film 106 located in the chip regions 102, while the first seal vias 121 connecting to the conductive layer 120 and the first seal wires 122 connecting to the first seal vias 121 are formed in the portions of the first interlayer insulating film 106 located in the seal ring formation regions. On the other hand, the first buffer vias 131 are formed in the portions of the first interlayer insulating film 106 located in the stress absorbing wall formation regions, while the accessory wire 140 is formed in the portion of the first interlayer insulating film 106 located in the scribe region 103.

Figure 7:
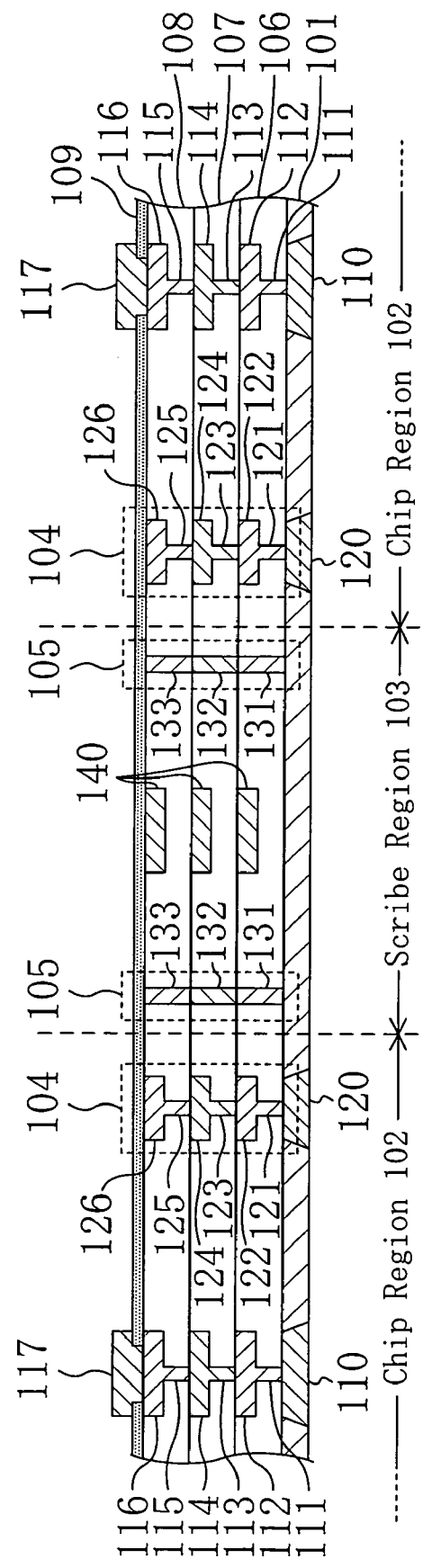
FIG. 7 is a cross-sectional view illustrating the individual process steps of the method for fabricating the electronic device according to the first embodiment.

Then, as shown in FIG. 7, a second interlayer insulating film 107 is formed on the first interlayer insulating film 106 in the same manner as in the steps shown in FIGS. 4 to 6. Thereafter, second vias 113 connecting to the first wires 112 and second wires 114 connecting to the second vias 113 (i.e., dual damascene wires composed of the second vias 113 and the second wires 114) are formed in the portions of the second interlayer insulating film 107 located in the chip regions 102, while second seal vias 123 connecting to the first seal wires 122 and second seal wires 124 connecting to the second seal vias 123 are formed in the portions of the second interlayer insulating film 107 located in the seal ring formation regions. At the same time, second buffer vias 132 connecting to the first buffer vias 131 are formed in the portions of the second interlayer insulating film 107 located in the stress absorbing wall formation regions, while the accessory wire 140 is formed in the portion of the second interlayer insulating film 107 located in the scribe region 103.

Subsequently, as shown in FIG. 7, a third interlayer insulating film 108 is formed on the second interlayer insulating film 107 in the same manner as in the steps shown in FIGS. 4 to 6. Then, third vias 115 connecting to the second wires 114 and third wires 116 connecting to the third vias 115 (i.e., dual damascene wires composed of the third vias 115 and the third wires 116) are formed in the portions of the third interlayer insulating film 108 located in the chip regions 102, while third seal vias 125 connecting to the second seal wires 124 and third seal wires 126 connecting to the third seal vias 125 are formed in the portions of the third interlayer insulating film 108 located in the seal ring formation regions. At the same time, third buffer vias 133 connecting to the second buffer vias 132 are formed in the portions of the third interlayer insulating film 108 located in the stress absorbing wall formation regions, while the accessory wire 140 is formed in the portion of the third interlayer insulating film 108 located in the scribe region 103.

The present embodiment has provided the dual damascene structures composed of the vias or the seal vias and the wires or the seal wires by using Cu in each of the interlayer insulating films. However, it is also possible to provide the vias and the seal vias by using W (tungsten) in the first-layer (lowermost-layer) interlayer insulating film, provide the wires and the seal wires (the lowermost-layer wires and seal wires) by using Cu in the second-layer interlayer insulating film, and provide the dual damascene structures composed of the vias or the seal vias and the wires or the seal wires by using Cu in each of the third- and higher-order-layer interlayer insulating films instead.

Then, as shown in FIG. 7, a passivation film 109 is deposited on the third interlayer insulating film 108 serving as the uppermost wiring layer to serve as a protective film therefor. Subsequently, openings corresponding to the third wires 116 are formed locally in the passivation film 109 by using a lithographic technology and a dry etching technology and then pad electrodes 117 connecting to the third wires 116 are formed in the openings, whereby the formation of the plurality of semiconductor devices in the wafer 101 is completed.

Thus, according to the present embodiment, the seal rings 104 composed of the seal vias 121, 123, and 125 and the seal wires 122, 124, and 126 are formed simultaneously with the formation of the vias 111, 113, and 115 and the wires 112, 114, and 116 in the chip regions 102. In addition, the stress absorbing walls 105 each having a multilayer structure consisting of the buffer vias 131, 132, and 133 can be formed outside the seal rings 104.

The wafer 101 thus formed with the semiconductor devices is diced along the scribe regions 103 and thereby separated into the individual semiconductor devices (semiconductor chips). At this time, impact, a stress, a crack resulting therefrom, or the like occurs first in the diced portion to propagate toward each of the chip regions 102. However, the impact, stress, crack, or the like is absorbed by the stress absorbing walls 105. In other words, the further propagation of the impact, stress, crack, or the like toward the chip regions 102 is blocked. This prevents damage to each of the seal rings 104 and allows each of the seal rings to retain the function of preventing the ingression of moisture, movable ions, or the like into the chip region 102 from outside thereof, which is one of the intrinsic functions of the seal ring. As a result, it becomes possible to fabricate a semiconductor device with high reliability.

According to the present embodiment, the individual components of each of the stress absorbing walls 105 are arranged discretely and independently of each other along the direction in which the seal ring 104 extends. Therefore, even though any of the individual components is damaged and destroyed by the crack or the like during wafer dicing, there is no such situation that the destruction of the stress absorbing wall 105 is enlarged along the direction in which the seal ring 104 extends. That is, since the individual components of the stress absorbing wall 105 are independent of each other, it becomes possible to prevent a component adjacent to the destroyed one from coming off as a result of being pulled thereby. By reducing the size (specifically, the length in the direction in which the seal ring 104 extends) of each of the components of the stress absorbing wall 105, even though any of the components is destroyed under the influence of the impact, stress, crack, or the like during dicing, only the destroyed component comes off from one of the individual semiconductor devices into which the wafer has been separated (semiconductor chips after dicing).

In the case where the stress absorbing wall is continuously surrounding the seal ring unlike in the present embodiment, the component the stress absorbing wall that has been damaged by dicing and likely to come off is left disadvantageously in the semiconductor chip after dicing by the other components of the stress absorbing wall connecting to the damaged component. Consequently, when packaging is performed with respect to the semiconductor chip, a defective product results from the contact between the damaged component of the stress absorbing wall and a bonding wire. By contrast, the present embodiment can prevent the problem of the defective product mentioned above since the damaged component of the stress absorbing wall comes off from the semiconductor chip after dicing without pulling the other components. A description will be given herein below to the effect achieved by the present embodiment with reference to the drawings.

Figure 8:
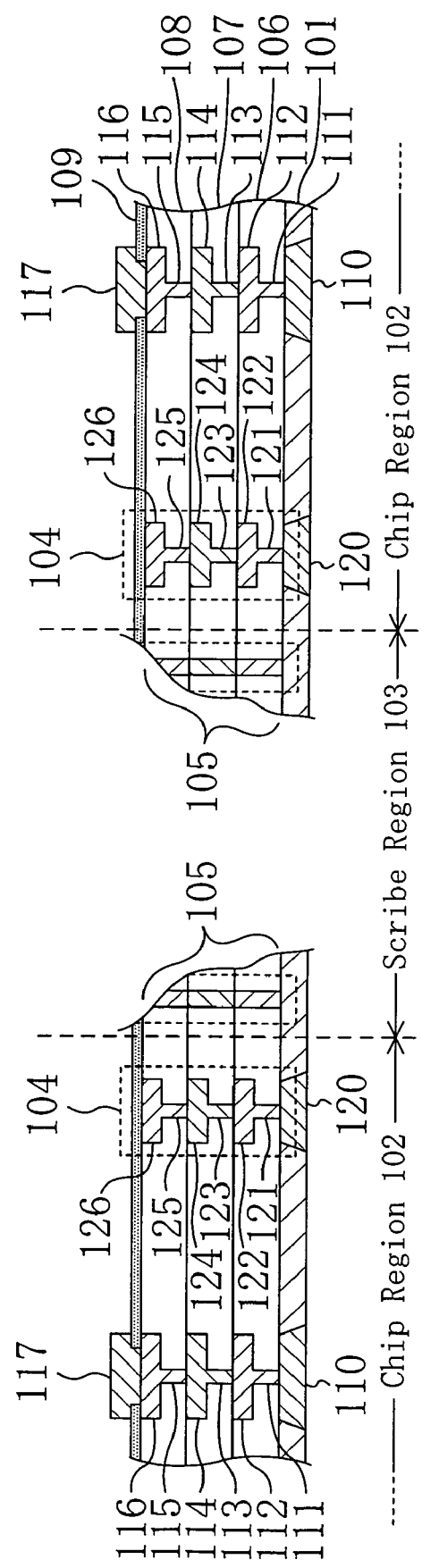
FIG. 8 is a post-dicing cross-sectional view taken along the line A-A' of FIG. 1.
Figure 9:
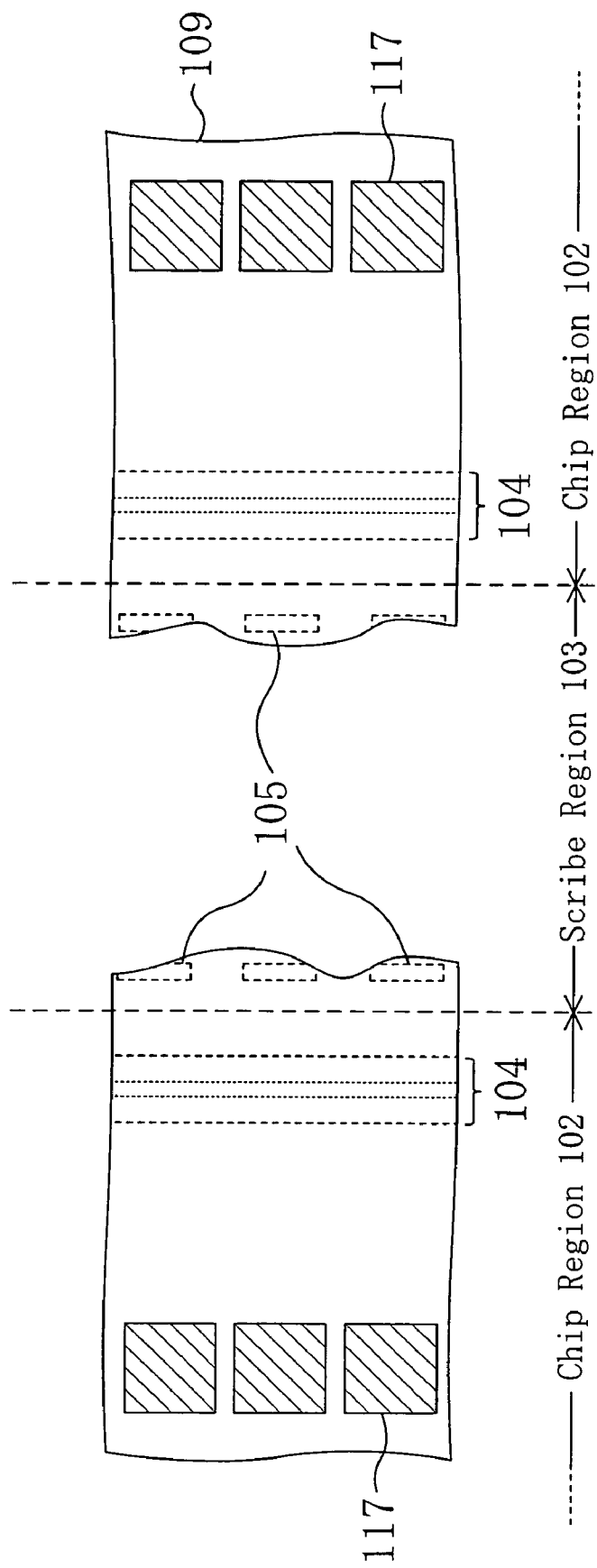
FIG. 9 is a post-dicing plan view obtained by enlarging the vicinity of the line A-A' of FIG. 1.
Figure 10:
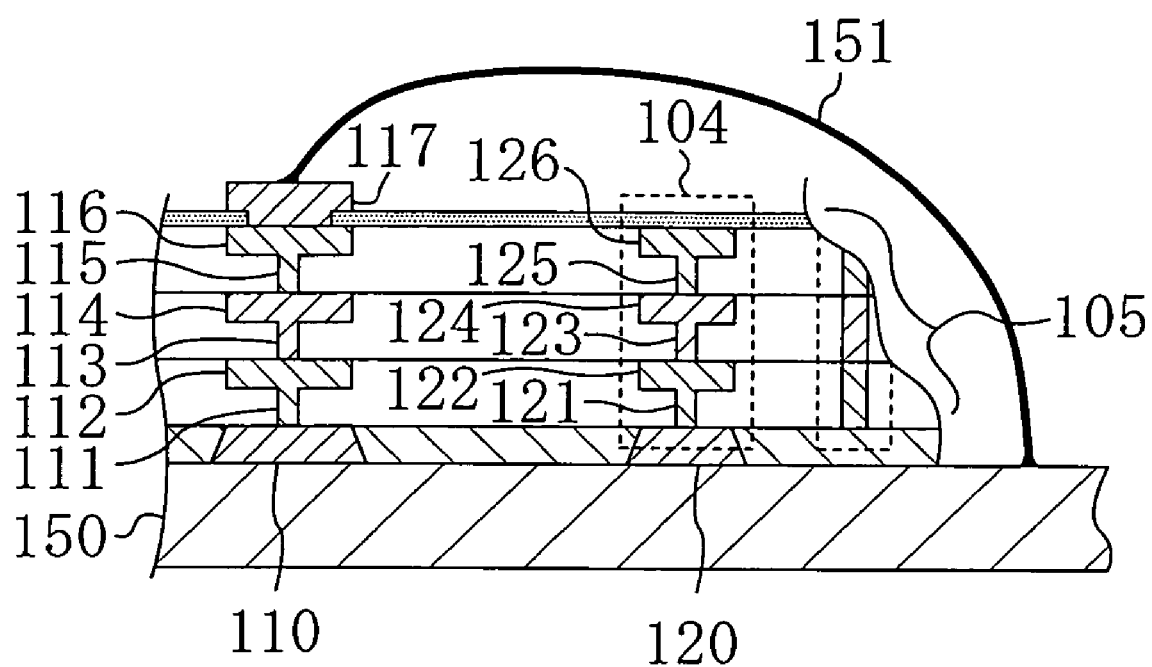
FIG. 10 is a cross-sectional view showing the electronic device (after dicing) according to the first embodiment, which has been mounted on a lead frame.

FIG. 8 is a post-dicing cross-sectional view (cross-sectional view of the end portions of the semiconductor devices including seal ring portions positioned in the peripheral portions of the chip regions 102 and, more specifically, of wiring structures in the chip regions 102 and the structures of the seal rings 104) taken along the line A-A' of FIG. 1. FIG. 9 is a post-dicing plan view obtained by enlarging the vicinity of the line A-A' of FIG. 1. FIGS. 8 and 9 are drawings corresponding to FIGS. 2 and 3, respectively. Each of FIGS. 8 and 9 shows the condition after dicing performed along the scribe region 103 interposed between the pair of chip regions 102. FIG. 10 is a cross-sectional view of the post-dicing semiconductor device according to the present embodiment shown in FIG. 8, which has been mounted on a lead frame.

As shown in FIG. 10, the post-dicing semiconductor device (i.e., the substrate 101) according to the present embodiment shown in FIG. 8 has been mounted on a lead frame 150, while the lead frame 150 (the portion on which the semiconductor device has not been mounted) and the pad electrode 117 on the semiconductor device according to the present embodiment have been connected to each other by using a bonding wire 151. As shown in FIGS. 8 to 10, according to the present embodiment, the damaged component of the stress absorbing wall 105 comes off from the chip after dicing (the post-dicing semiconductor device according to the present embodiment) without pulling the other components. Accordingly, it becomes possible to prevent a defective product resulting from the contact between the damaged component of the stress absorbing wall 105 and the bonding wire 151 when packaging is performed with respect to the semiconductor chip.

Figure 11:
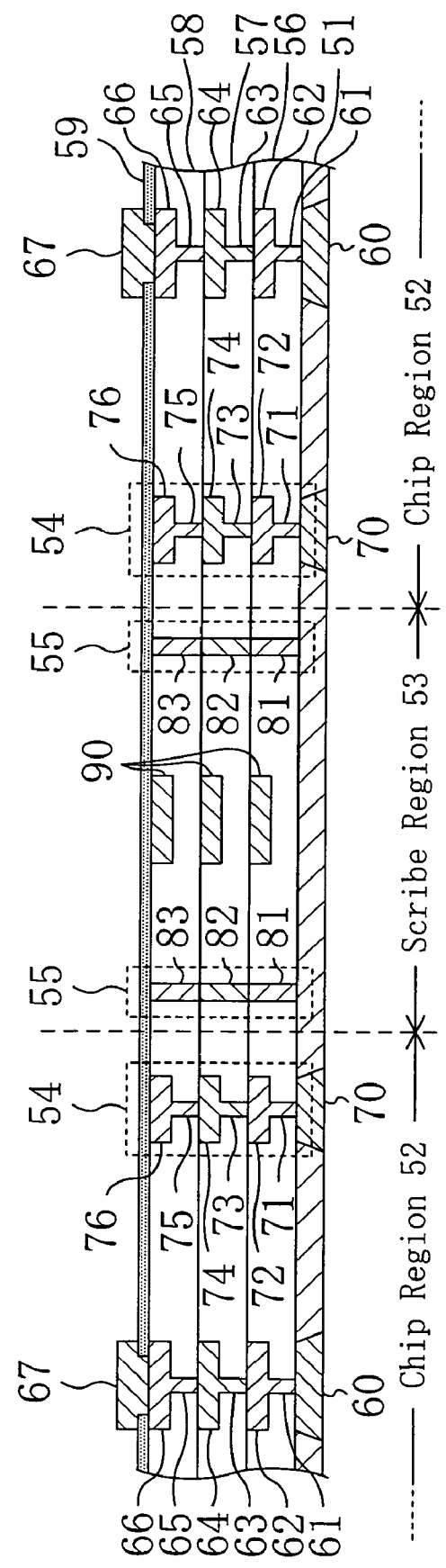
FIG. 11 is a cross-sectional view of the end portions of pre-dicing semiconductor devices according to a comparative example.
Figure 12:
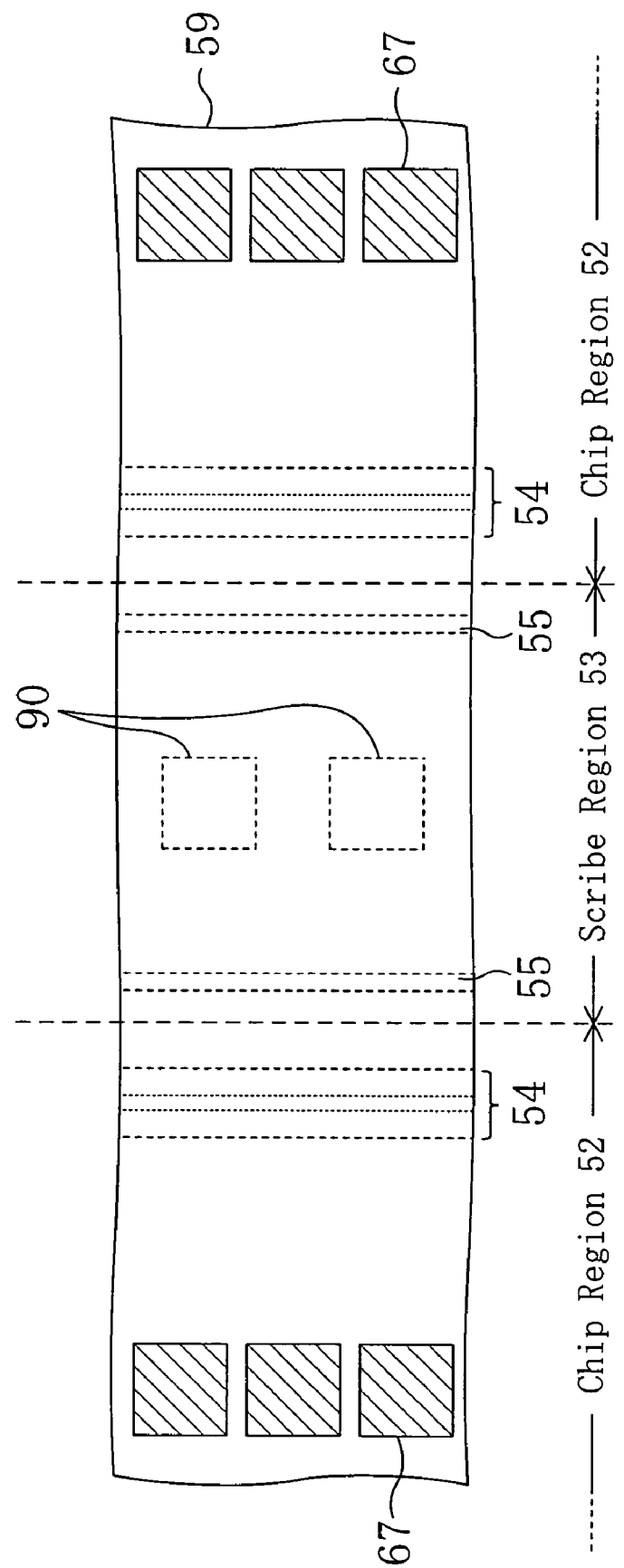
FIG. 12 is a plan view of the end portions of the pre-dicing semiconductor devices according to the comparative example.

By contrast, FIG. 11 is a cross-sectional view of the end portions of pre-dicing semiconductor devices according to a comparative example, which comprise stress absorbing walls continuously surrounding seal rings. FIG. 12 is a plan view of the end portions. FIGS. 11 and 12 are drawings corresponding to FIGS. 2 and 3, respectively. Each of FIGS. 11 and 12 shows the respective end portions of a pair of chip regions with a scribe region interposed therebetween.

As shown in FIGS. 11 and 12, each of the pre-dicing semiconductor devices according to the comparative example is composed of a chip region 52 and a scribe region 53. A seal ring 54 is formed in the portion of the chip region 52 which is adjacent to the boundary with the scribe region 53, while a stress absorbing wall 55 is formed outside the seal ring 54 (in the portion of the scribe region 53 which is adjacent to the chip region 52).

As shown in FIG. 11, active layers 60 composing elements such as a transistor are formed in the chip regions 52 of a wafer 51 (hereinafter referred to as the substrate 51), while conductive layers 70 similarly constituted to the active layers 60 are formed in the peripheral portions (seal ring formation regions adjacent to the scribe region 53) of the chip regions 52 of the substrate 51.

As also shown in FIG. 11, a first interlayer insulating film 56 is formed on the substrate 51 and first vias 61 connecting to the active layers 60 and first wires 62 connecting to the first vias 61 are formed in the portions of the first interlayer insulating film 56 located in the chip regions 52, while first seal vias 71 connecting to the conductive layers 70 and first seal wires 72 connecting to the first seal vias 71 are formed in the portions of the first interlayer insulating film 56 located in the seal ring formation regions. On the other hand, first buffer vias 81 are formed in the portions of the first interlayer insulating film 56 located in the stress absorbing wall formation regions, while an accessory wire 90 is formed in the portion of the first interlayer insulating film 56 located in the scribe region 53.

As also shown in FIG. 11, a second interlayer insulating film 57 is formed on the first interlayer insulating film 56 and second vias 63 connecting to the first wires 62 and second wires 64 connecting to the second vias 63 are formed in the portions of the second interlayer insulating film 57 located in the chip regions 52, while second seal vias 73 connecting to the first seal wires 72 and second seal wires 74 connecting to the second seal vias 73 are formed in the portions of the second interlayer insulating film 57 located in the seal ring formation regions. On the other hand, second buffer vias 82 connecting to the first buffer vias 81 are formed in the portions of the second interlayer insulating film 57 located in the stress absorbing wall formation regions, while the accessory wire 90 is formed in the portion of the second interlayer insulating film 57 located in the scribe region 53.

As also shown in FIG. 11, a third interlayer insulating film 58 is formed on the second interlayer insulating film 57 and third vias 65 connecting to the second wires 64 and third wires 66 connecting to the third vias 65 (i.e., dual damascene wires composed of the third vias 65 and the third wires 66) are formed in the portions of the third interlayer insulating film 58 located in the chip regions 52, while third seal vias 75 connecting to the second seal wires 74 and third seal wires 76 connecting to the third seal vias 75 are formed in the portions of the third interlayer insulating film 58 located in the seal ring formation regions. On the other hand, third buffer vias 83 connecting to the second buffer vias 82 are formed in the portions of the third interlayer insulating film 58 located in the stress absorbing wall formation regions, while the accessory wire 90 is formed in the portion of the third interlayer insulating film 58 located in the scribe region 53.

The comparative example has provided the dual damascene structures composed of the vias or the seal vias and the wires or the seal wires by using Cu in each of the interlayer insulating films. However, it is also possible to provide the vias and the seal vias by using W in the first-layer (lowermost-layer) interlayer insulating film, provide the wires and the seal wires (the lowermost-layer wires and seal wires) by using Cu in the second-layer interlayer insulating film, and provide the dual damascene structures composed of the vias or the seal vias and the wires or the seal wires by using Cu in each of the third- and higher-order-layer interlayer insulating films instead.

As shown in FIG. 11, a passivation film 59 is further deposited on the third interlayer insulating film 58 serving as the uppermost wiring layer to serve as a protective film therefor. In addition, openings corresponding to the third wires 66 are formed locally in the passivation film 59 and pad electrodes 67 connecting to the third wires 66 are formed in the openings.

As shown in FIG. 12, in the semiconductor device according to the comparative example, the stress absorbing walls 55 are formed to continuously surround the seal rings 104, which is different from the present embodiment.

Figure 13:
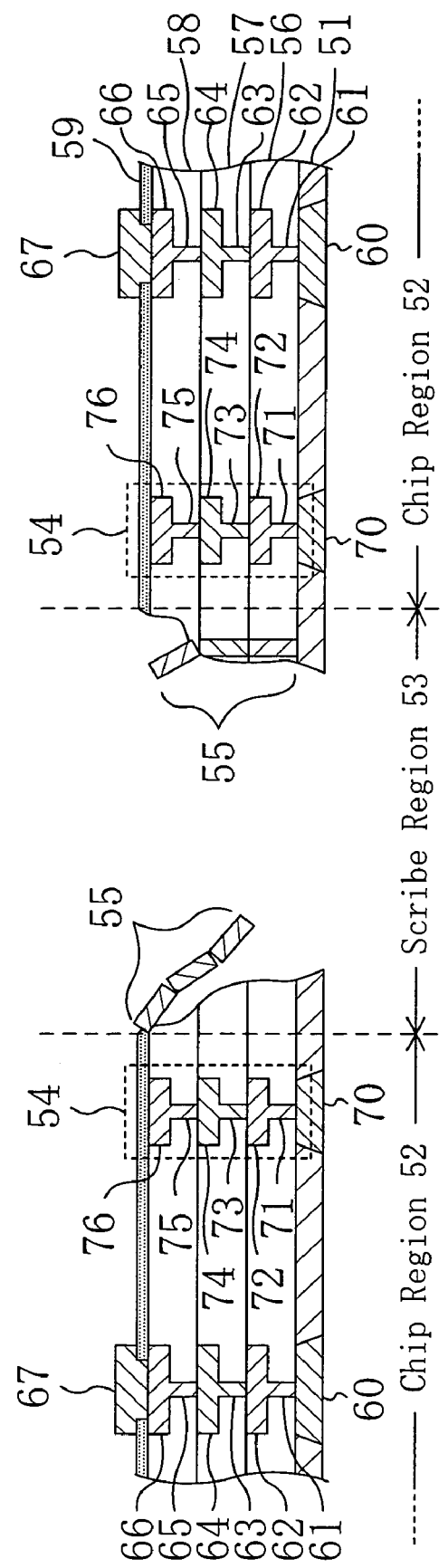
FIG. 13 is a cross-sectional view of the ends portion of the post-dicing semiconductor devices according to the comparative example.
Figure 14:
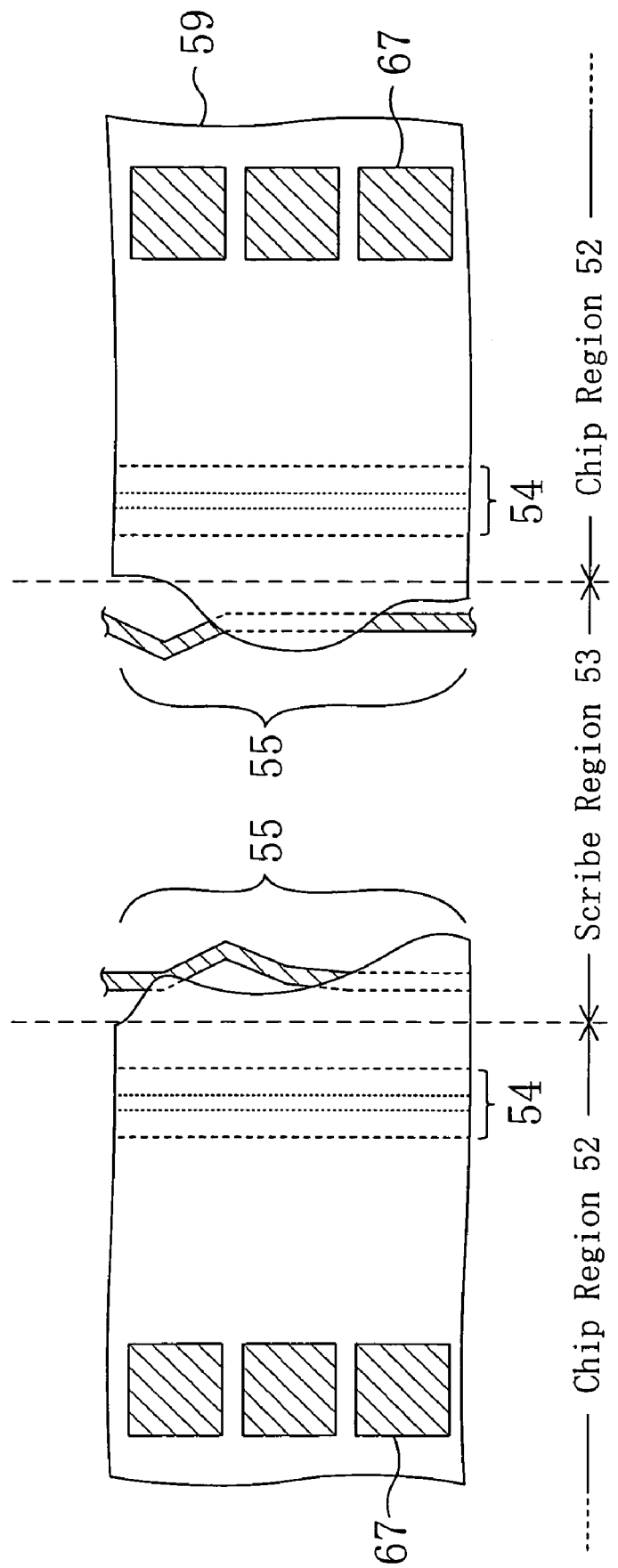
FIG. 14 is a plan view of the end portions of the post-dicing semiconductor devices according to the comparative example.
Figure 15:
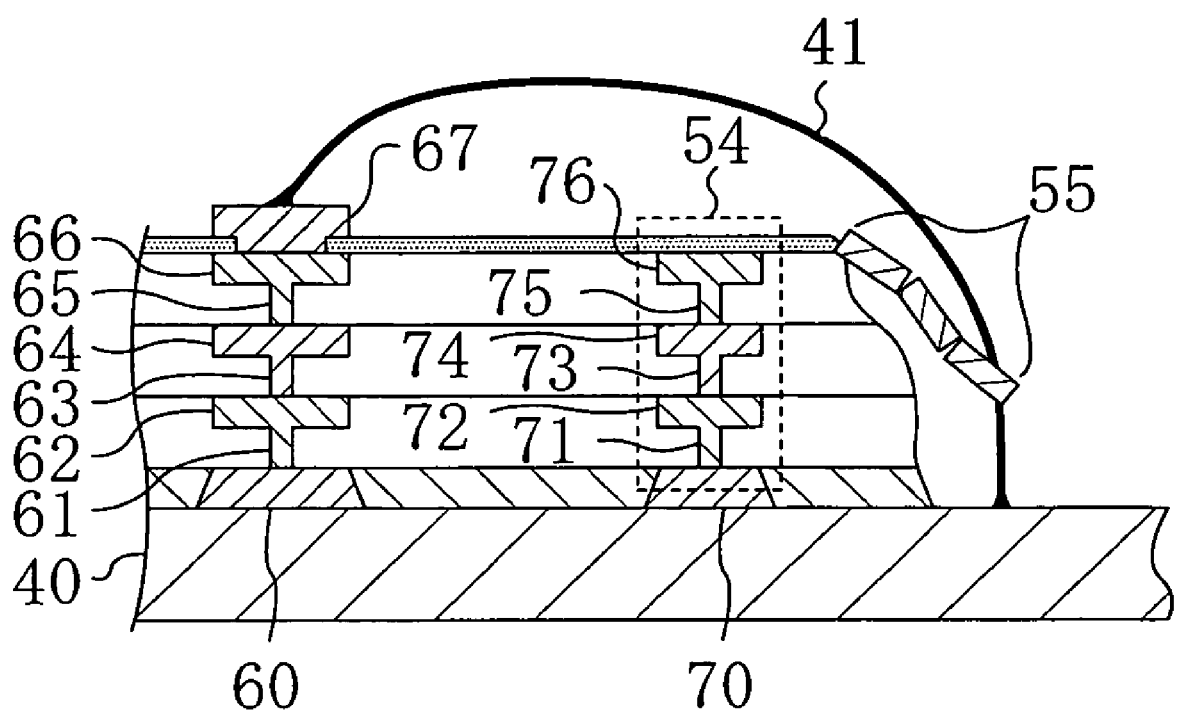
FIG. 15 is a cross-sectional view showing the semiconductor device (after dicing) according to the comparative example, which has been mounted on a lead frame.

FIG. 13 is a cross-sectional view of the end portions of the post-dicing semiconductor devices according to the comparative example. FIG. 14 is a plan view of the end portions. FIGS. 13 and 14 are drawings corresponding to FIGS. 11 and 12, respectively. Each of FIGS. 13 and 14 shows the respective end portions of the pair of chip regions with the scribe region interposed therebetween. FIG. 15 is a cross-sectional view of the post-dicing semiconductor device according to the comparative example shown in FIG. 13, which has been mounted on a lead frame.

As shown in FIG. 15, the post-dicing semiconductor device (i.e., the substrate 51) according to the comparative example shown in FIG. 13 has been mounted on a lead frame 40, while the lead frame 40 (the portion on which the semiconductor device has not been mounted) and the pad electrodes 67 on the semiconductor device according to the comparative example have been connected to each other by using a bonding wire 41. As shown in FIGS. 13 to 15, in the comparative example, the component of the stress absorbing wall 55 that has been damaged by dicing and likely to come off is left disadvantageously in the semiconductor chip after dicing (the post-dicing semiconductor device according to the comparative example) by the other components of the stress absorbing wall 55 connecting to the damaged component. Consequently, when packaging is performed with respect to the semiconductor chip, a defective product results from the contact between the damaged component of the stress absorbing wall 55 and the bonding wire 41, as shown in FIG. 15.

Although the present embodiment has used the multilayer structure consisting of the vias (the buffer vias 131, 132, and 133) as the stress absorbing wall 105, it is also possible to use a multilayer structure consisting of vias and wires, which is similar to that of the seal ring 104, instead. Although the present embodiment has used the multilayer structure consisting of the vias (seal vias 121, 123, and 125) and the wires (the seal wires 122, 124, and 126) as the seal ring 104, it is also possible to use a multilayer structure consisting only of vias, which is similar to that of the stress absorbing wall 105. In the case where the multilayer structure consisting only of the vias is used as each of the seal ring 104 and the stress absorbing wall 105, a region in a widthwise direction (direction perpendicular to the direction in which the seal ring 104 extends along the periphery of the chip region 102) occupied by the seal ring 104 and the stress absorbing wall 105 in the semiconductor device can be reduced compared with the case where the multilayer structure consisting of the vias and the wires is used. This is effective in reducing the size of the semiconductor device.

In the present embodiment, at least one or more of the individual conductors (parts) that have been stacked in layers to compose the seal rings 104 are formed preferably in the step of forming the wires having the dual damascene structures. This allows the parts of the seal rings 104 to penetrate at least one of the interlayer insulating films without leaving seams. That is, by forming the parts of the seal rings 104 in the process of forming the dual damascene wires, the "seams" of each of the seal rings 104 can be reduced in the entire chip region 102 formed with the seal ring, elements such as a transistor, a wiring layer, and the like. As a result, it becomes possible to prevent the ingression of impact that has occurred during wafer dicing or moisture from the outside into the chip region 102.

Although the present embodiment has formed the stress absorbing wall 105 in the scribe region 103, it is not limited thereto. The same effect is obtainable irrespective of the position at which the stress absorbing wall 105 is formed provided that the stress absorbing wall 105 is interposed between the diced portion of the wafer and the seal ring 104. Specifically, the stress absorbing wall 105 may also be provided outside the seal ring 104, e.g., in the portion of each of the chip regions 102 which is adjacent to the boundary with the scribe region 103.

Although the present embodiment has provided the seal ring 104 in the portion of each of the chip regions 102 which is adjacent to the boundary with the scribe region 103, the seal ring 104 may also be provided internally of the stress absorbing wall 105, e.g., in the portion of the scribe region 103 which remains as the end portion of the semiconductor device (semiconductor chip) even after the dicing (i.e., the portion of the scribe region 103 which is adjacent to the boundary with the chip region 102).

Although the present embodiment has formed the wiring structure in the three interlayer insulating films stacked in layers, the number of the interlayer insulating films stacked in layers is not limited to 3. It will easily be appreciated that the number of the interlayer insulating films stacked in layers may be smaller or larger than 3 depending on the chip structure.

Although the present embodiment has used Cu as a conductive material for composing each of the seal ring 104 and the stress absorbing wall 105, it is not limited thereto. It is also possible to use at least one of W, Al, and Cu to compose each of the seal ring 104 and the stress absorbing wall 105. This allows the seal ring 104 and the stress absorbing wall 105 to be formed from the same material as composing the wires and the vias formed in the chip region 102 of the semiconductor device.

Embodiment 2

An electronic device according to a second embodiment of the present invention and a method for fabricating the same will be described with reference to the drawings.

Figure 16:
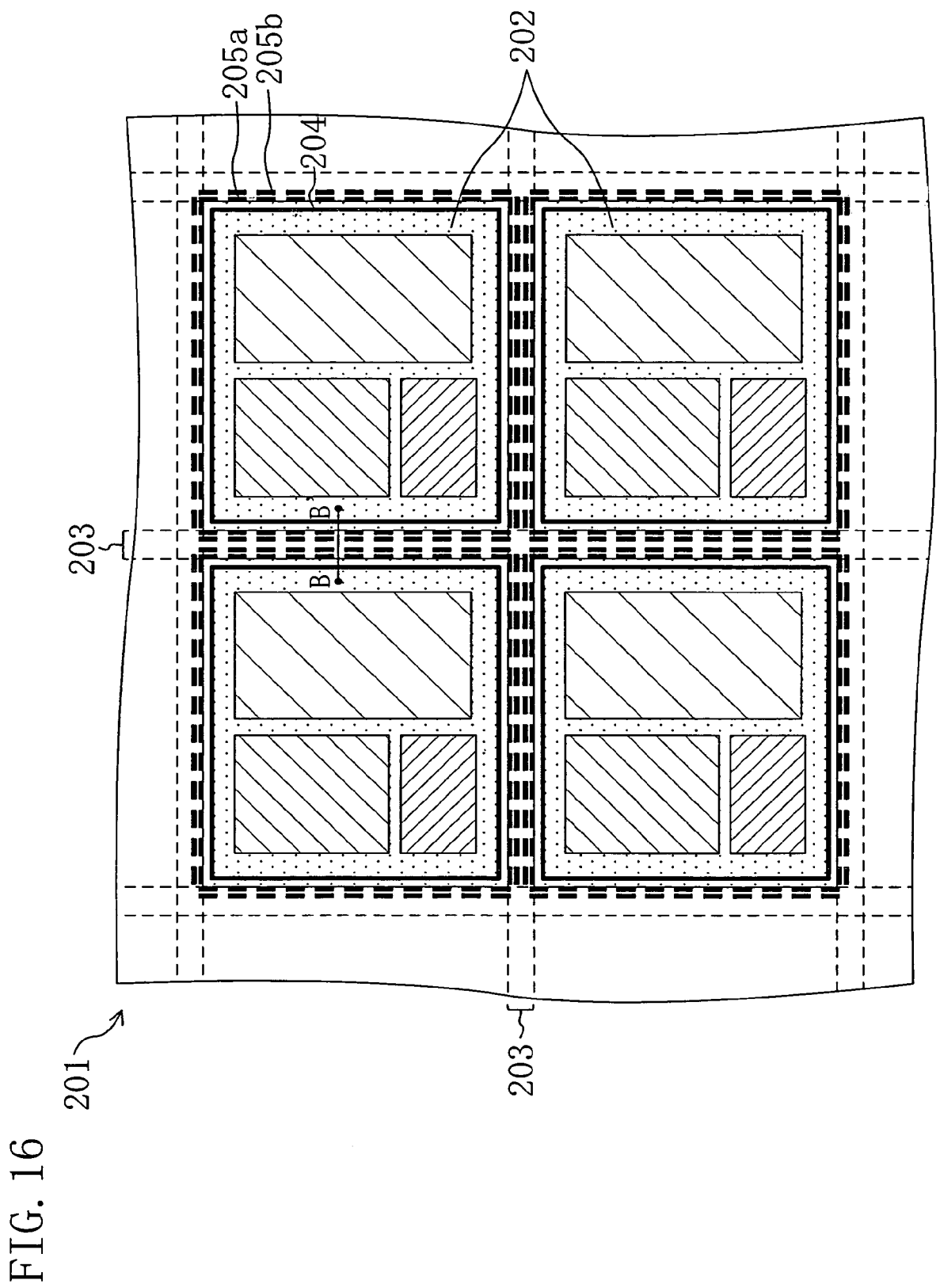
FIG. 16 is a plan view showing a part of a wafer provided with an electronic device according to a second embodiment of the present invention.

FIG. 16 is a plan view showing a part of a wafer provided with an electronic device (a semiconductor device having a seal ring singly surrounding a chip region) according to the second embodiment.

As shown in FIG. 16, a plurality of chip regions 202, each of which is to serve as a semiconductor device, are arranged in a wafer 201 serving as a semiconductor substrate represented by, e.g., a silicon substrate or the like. Each of the chip regions 202 is provided with an IC composed of a plurality of elements and having a specified function. The individual chip regions 202 are defined by scribe regions 203 provided in a grid-like configuration.

Each one of the semiconductor devices (i.e., each one of the semiconductor chips) is comprised herein of: a chip region 202 in which an IC circuit composed of the plurality of elements and having the specified function; a seal ring 204 provided in the peripheral portion of the chip region 202 to surround the chip region 202; and stress absorbing walls 205a and 205b in a double structure according to the present invention which are provided outside the seal ring 204 to discretely surround the seal ring 204. Thus, the semiconductor device according to the present embodiment has basically the same structure as the semiconductor device according to the first embodiment except that the stress absorbing walls 205 are in the double structure.

In the present embodiment, the stress absorbing walls 205 in a double or higher-order multiple structure, such as a triple or quadruple structure, may also be provided depending on layout margin.

The wafer 201 thus formed with the plurality of semiconductor devices is diced along the scribe regions 203 so that it is separated into the individual semiconductor devices (semiconductor chips). At this time, since the stress absorbing walls 205 are formed in a double or higher-order multiple structure to surround the chip region 202, even though one of the stress absorbing walls (specifically the outer stress absorbing wall 205b) is destroyed by impact, a stress, or the like that has occurred during dicing or a crack resulting therefrom and the impact, stress, or the like propagates inwardly, i.e., toward the inner portion the chip 202, the other stress absorbing wall (specifically the inner stress absorbing wall 205a) located internally of the destroyed stress absorbing wall absorbs the impact, stress, or the like. This successfully prevents the impact, stress, crack, or the like from reaching and thereby destroying the seal ring 204. Accordingly, it becomes possible to prevent damage to the seal ring 204 and the chip region 202 in the step of dividing the wafer 201 into the semiconductor chips and thereby prevent the degradation of the performance of the semiconductor chip.

Figure 17:
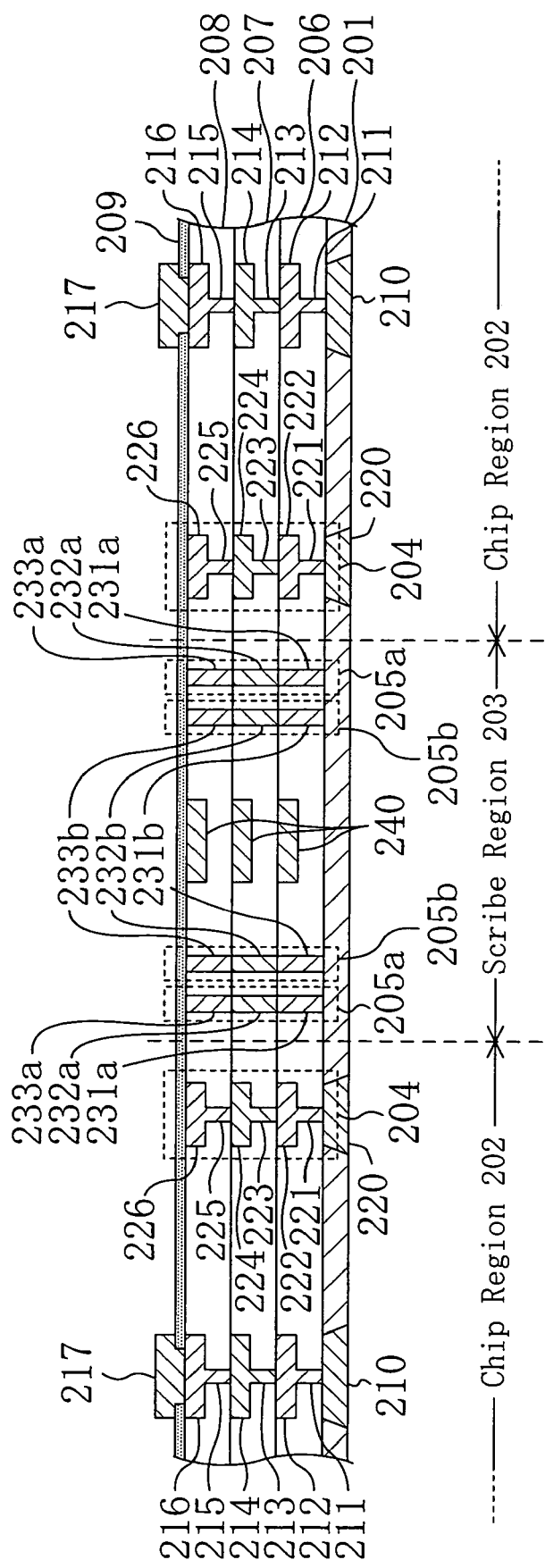
FIG. 17 is a cross-sectional view taken along the line B-B' of FIG. 16.
Figure 18:
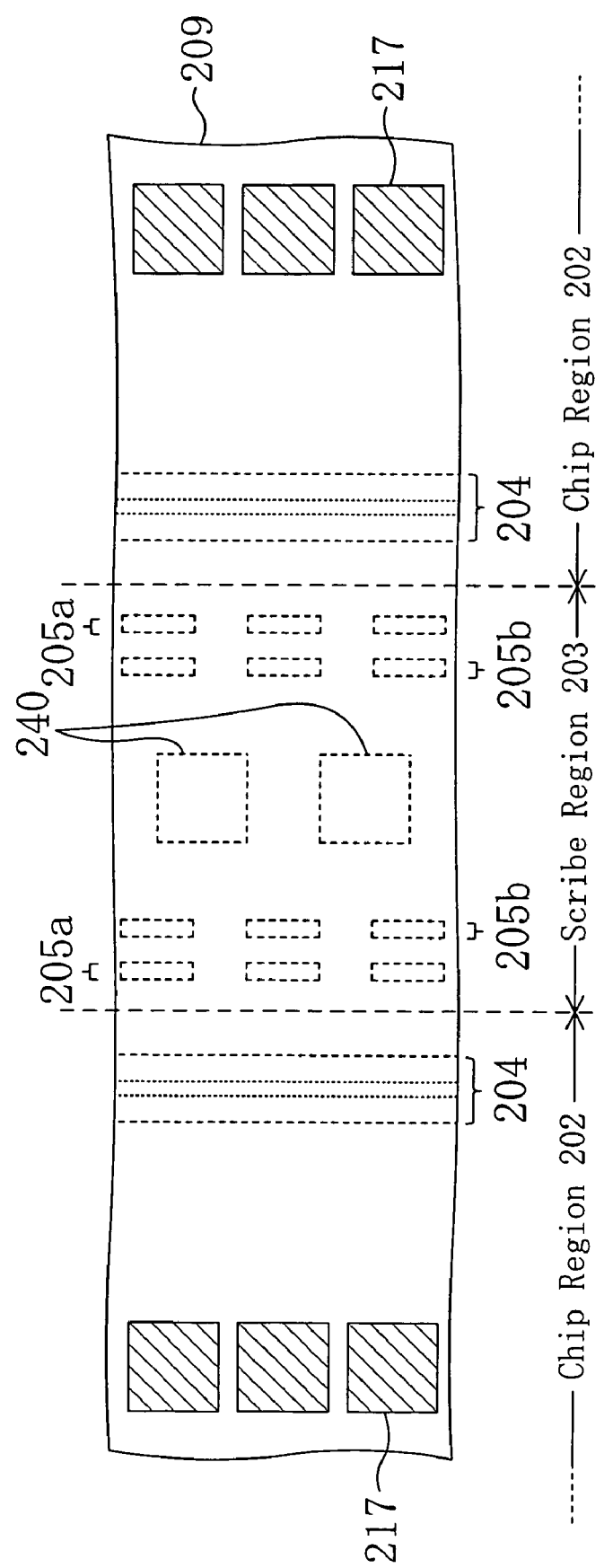
FIG. 18 is a plan view obtained by enlarging the vicinity of the line B-B' of FIG. 16.

FIG. 17 is a cross-sectional view (cross-sectional view of the end portions of the semiconductor devices including seal ring portions positioned in the peripheral portions of the chip regions 202 and, more specifically, of wiring structures in the chip regions 202 and the structures of the seal rings 204) taken along the line B-B' of FIG. 16. FIG. 18 is a plan view obtained by enlarging the vicinity of the line B-B' of FIG. 16. Each of FIGS. 17 and 18 shows the respective end portions of the pair of chip regions 202 with the scribe region 203 interposed therebetween.

As shown in FIGS. 17 and 18, each of the semiconductor devices prior to dicing is composed of the chip region 202 and the scribe region 203. The seal ring 204 is formed in the portion of the chip region 202 which is adjacent to the boundary with the scribe region 203, while the stress absorbing walls 205a and 205b in the double structure are formed outside the seal ring 204 (in the portions of the scribe region 203 which are adjacent to the chip region 202).

A description will be given herein below to the method for fabricating the semiconductor device having the structure shown in FIGS. 17 and 18 with reference to FIGS. 19, 20, 21, and 22.

Figure 19:
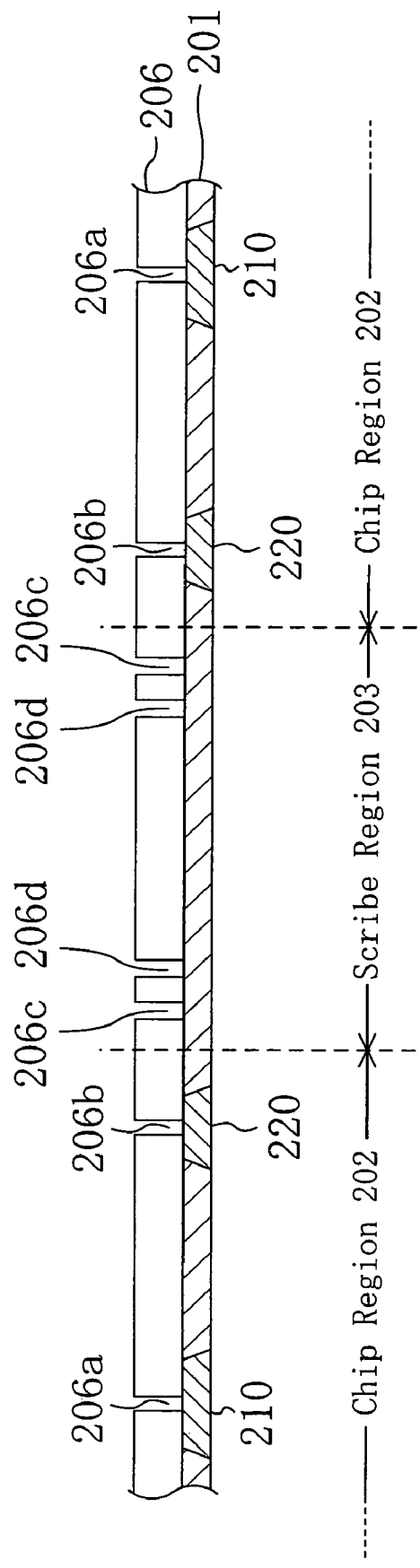
FIG. 19 is a cross-sectional view illustrating the individual process steps of a method for fabricating an electronic device according to the second embodiment.

First, as shown in FIG. 19, active layers 210 composing elements such as a transistor are formed in the chip regions 202 of the wafer 201 (hereinafter referred to as the substrate 201), while conductive layers 220 similarly constituted to the active layers 210 are formed in the peripheral portions (the regions to be formed with the seal rings which are adjacent to the scribe region 203) of the chip regions 202 of the substrate 201.

Next, a first interlayer insulating film 206 is deposited on the substrate 201. Then, via holes 206a for forming first vias 211 (see FIG. 21) are formed in the portions of the first interlayer insulating film 206 located in the chip regions 202 by using a lithographic technology and a dry etching technology, while trench-like depressed portions 206b for forming first seal vias (see FIG. 21) are formed in the portions of the first interlayer insulating film 206 located in seal ring formation regions. At the same time, a plurality of depressed portions 206c for forming first buffer vias 231a (see FIG. 21) and a plurality of depressed portions 206d for forming first buffer vias 231b (see FIG. 21) are formed in the portions of the first interlayer insulating film 206 located in stress absorbing wall formation regions (the portions of the scribe region 203 which are adjacent to the chip regions 202).

Although the present embodiment has simultaneously formed the trench-like depressed portions 206b for forming the first seal vias 221 and the depressed portions 206c and 206d for forming the first buffer vias 231a and 231b in forming the via holes 206a in the portions of the first interlayer insulating film 206 located in the chip regions 202, it will easily be appreciated that the via holes 206a, the trench-like depressed portions 206b, and the depressed portions 206c and 206d may be formed individually or, alternatively, any two of these depressed portions may be formed simultaneously.

Figure 20:
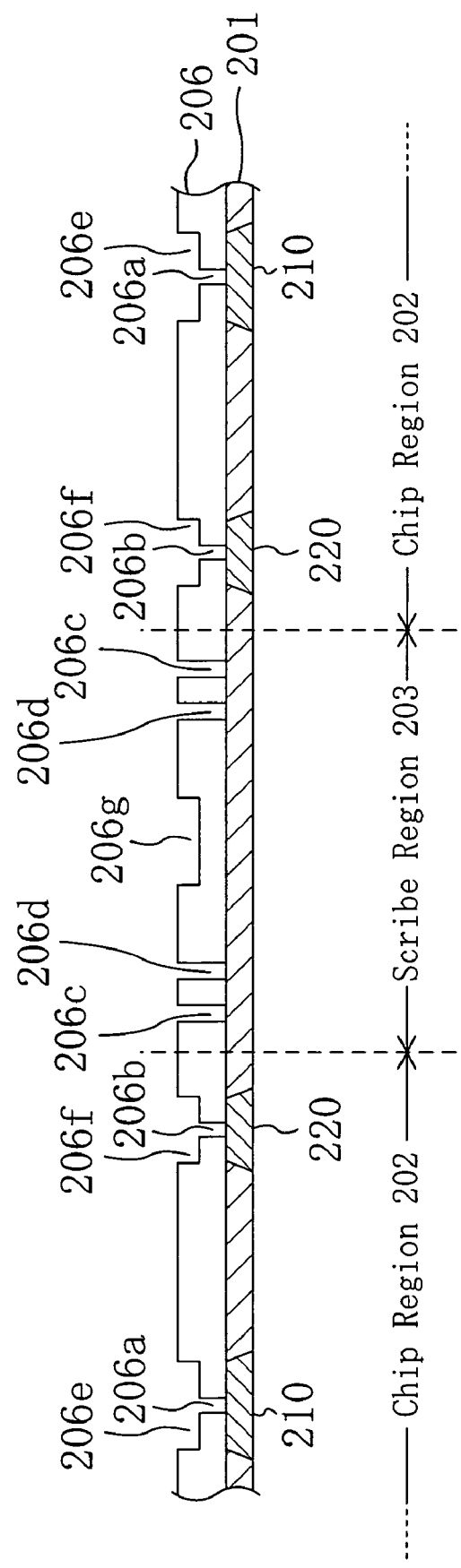
FIG. 20 is a cross-sectional view illustrating the individual process steps of the method for fabricating the electronic device according to the second embodiment.

Next, as shown in FIG. 20, by using a lithographic technology and a dry etching technology, wire trenches 206e for forming first wires 212 (see FIG. 21) are formed in the portions of the first interlayer insulating film 206 located in the chip regions 202 in such a manner as to connect to the via holes 206a, while wire trenches 206f for forming first seal wires 221 (see FIG. 21) are formed in the portions of the first interlayer insulating film 206 located in the seal ring formation regions in such a manner as to connect to the trench-like depressed portions 206b. In addition, a wire trench 206g for forming an accessory wire 240, which serves as an alignment mark for lithography or the like, may also be formed simultaneously in the portion of the first interlayer insulating film 206 located in the scribe region 203.

Figure 21:
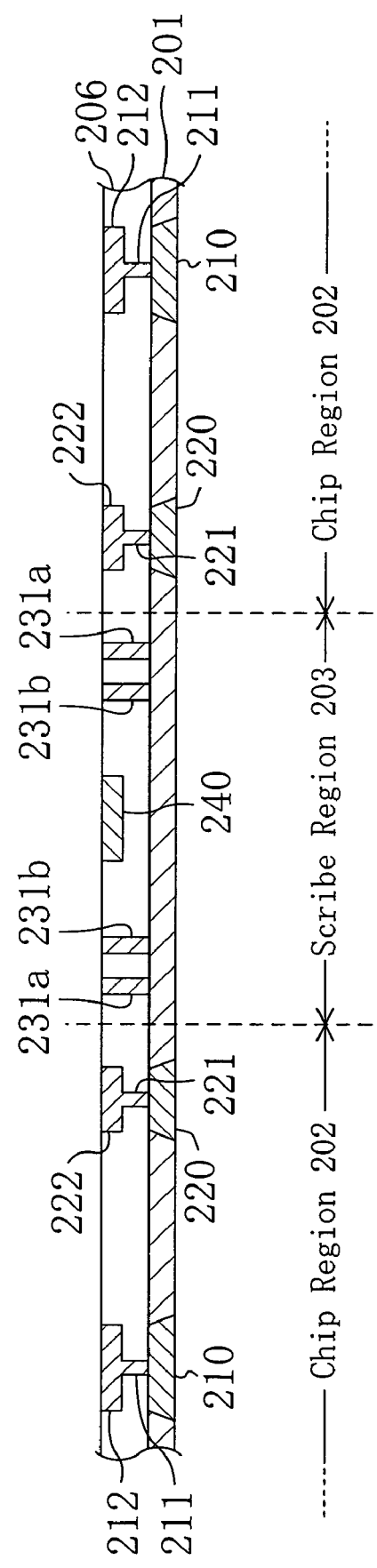
FIG. 21 is a cross-sectional view illustrating the individual process steps of the method for fabricating the electronic device according to the second embodiment.

Next, as shown in FIG. 21, a conductive film made of, e.g., Cu is filled by using, e.g., an electric plating technology, in each of the via holes 206a, the trench-like depressed portions 206b, the depressed portions 206c and 206d, and the wire trenches 206e, 206f, and 206g. After that, the portion of the conductive film protruding from the depressed portions 206c and 206d and the wire trenches 206e, 206f, and 206g (the portion of the conductive film which is located above the first interlayer insulating film 206) is removed by, e.g., CMP (chemical mechanical polishing). As a result, the first vias 211 connecting to the active layer 210 and the first wires 212 connecting to the first vias 211 (i.e., dual damascene wires composed of the first vias 211 and the first wires 212) are formed in the portions of the first interlayer insulating film 206 located in the chip regions 202, while the first seal vias 221 connecting to the conductive layer 220 and the first seal wires 222 connecting to the first seal vias 221 are formed in the portions of the first interlayer insulating film 206 located in the seal ring formation regions. On the other hand, the first buffer vias 231a and 231b are formed in the portions of the first interlayer insulating film 206 located in the stress absorbing wall formation regions, while the accessory wire 240 is formed in the portion of the first interlayer insulating film 206 located in the scribe region 203.

Figure 22:
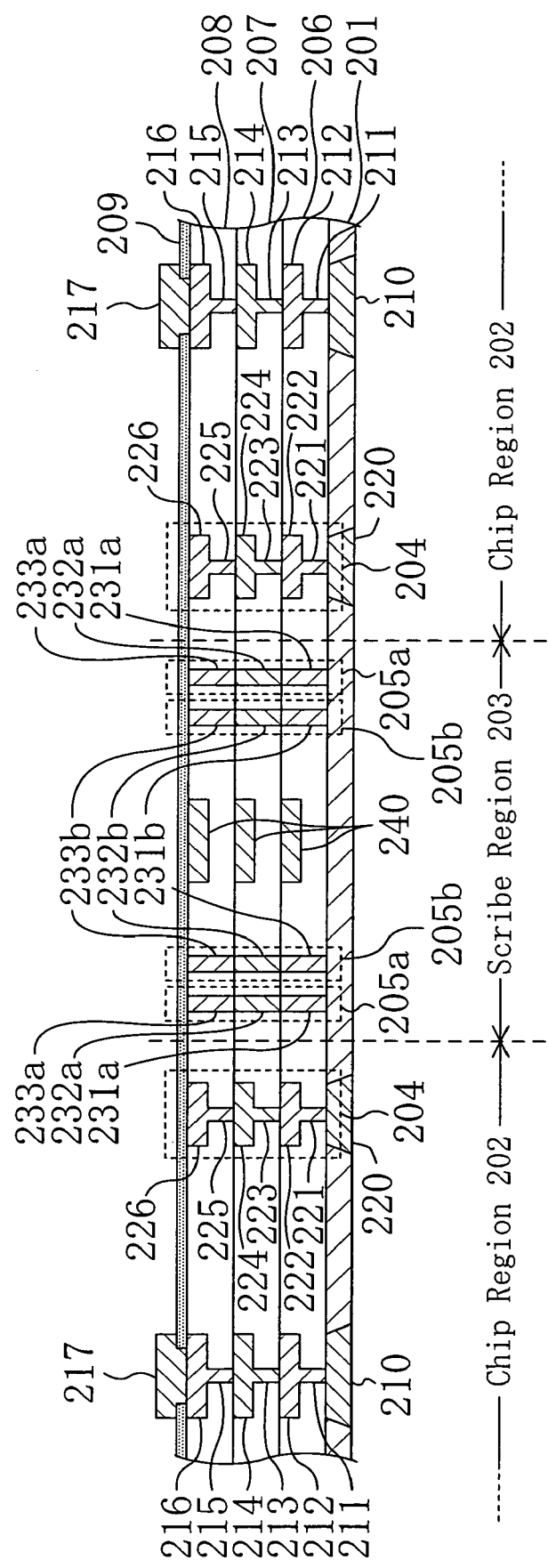
FIG. 22 is a cross-sectional view illustrating the individual process steps of the method for fabricating the electronic device according to the second embodiment.

Then, as shown in FIG. 22, a second interlayer insulating film 207 is formed on the first interlayer insulating film 206 in the same manner as in the steps shown in FIGS. 19 to 21. Thereafter, second vias 213 connecting to the first wires 212 and second wires 214 connecting to the second vias 213 (i.e., dual damascene wires composed of the second vias 213 and the second wires 214) are formed in the portions of the second interlayer insulating film 207 located in the chip regions 202, while second seal vias 223 connecting to the first seal wires 222 and second seal wires 224 connecting to the second seal vias 223 are formed in the portions of the second interlayer insulating film 207 located in the seal ring formation regions. At the same time, second buffer vias 232a and 232b connecting to the first buffer vias 231a and 231b are formed in the portions of the second interlayer insulating film 207 located in the stress absorbing wall formation regions, while the accessory wire 240 is formed in the portion of the second interlayer insulating film 207 located in the scribe region 203.

Subsequently, as shown in FIG. 22, a third interlayer insulating film 208 is formed on the second interlayer insulating film 207 in the same manner as in the steps shown in FIGS. 19 to 21. Then, third vias 215 connecting to the second wires 214 and third wires 216 connecting to the third vias 215 (i.e., dual damascene wires composed of the third vias 215 and the third wires 216) are formed in the portions of the third interlayer insulating film 208 located in the chip regions 202, while third seal vias 225 connecting to the second seal wires 224 and third seal wires 226 connecting to the third seal wires 225 are formed in the portions of the third interlayer insulating film 208 located in the seal ring formation regions. At the same time, third buffer vias 233a and 233b connecting to the second buffer vias 232a and 232b are formed in the portions of the third interlayer insulating film 208 located in the stress absorbing wall formation regions, while the accessory wire 240 is formed in the portion of the third interlayer insulating film 208 located in the scribe region 203.

The present embodiment has provided the dual damascene structures composed of the vias or the seal vias and the wires or the seal wires by using Cu in each of the interlayer insulating films. However, it is also possible to provide the vias and the seal vias by using W in the first-layer (lowermost-layer) interlayer insulating film, provide the wires and the seal wires (the lowermost-layer wires and seal wires) by using Cu in the second-layer interlayer insulating film, and provide the dual damascene structures composed of the vias or the seal vias and the wires or the seal wires by using Cu in each of the third- and higher-order-layer interlayer insulating films instead.

Then, as shown in FIG. 22, a passivation film 209 is deposited on the third interlayer insulating film 208 serving as the uppermost wiring layer to serve as a protective film therefor. Subsequently, openings corresponding to the third wires 216 are formed locally in the passivation film 209 by using a lithographic technology and a dry etching technology and then pad electrodes 217 connecting to the third wires 216 are formed in the openings, whereby the formation of the plurality of semiconductor devices in the wafer 201 is completed.

In short, the method for fabricating the semiconductor device according to the present embodiment is the same as the method for fabricating the semiconductor device according to the first embodiment except that the stress absorbing walls 205 are formed in the double structure, i.e., the two multilayer structures consisting of the buffer vias are formed.

Thus, according to the present embodiment, the seal rings 204 composed of the seal vias 221, 223, and 225 and the seal wires 222, 224, and 226 are formed simultaneously with the formation of the vias 211, 213, and 215 and the wires 212, 214, and 216 in the chip regions 202. In addition, the stress absorbing walls 205a each having a multilayer structure consisting of the buffer vias 231a, 232a, and 233a and the stress absorbing walls 205b each having a multilayer structure consisting of the buffer vias 231b, 232b, and 233b, i.e., the stress absorbing walls 205 each having the double structure can be formed outside the seal rings 204.

The wafer 201 thus formed with the semiconductor devices in accordance with the method described above is diced along the scribe regions 203 and thereby separated into the individual semiconductor devices (semiconductor chips). At this time, impact, a stress, a crack resulting therefrom, or the like occurs first in the diced portion to propagate toward each of the chip regions 202. At this time, even though the outer stress absorbing wall 205b is destroyed by the impact, stress, crack, or the like and the impact or the like propagates toward the inner portion of the chip region 202, the impact, stress, crack, or the like is absorbed by the stress absorbing wall 205a located internally of the destroyed stress absorbing wall 205b so that the further propagation of the impact or the like toward the inner portion of the chip region 202 is prevented successfully. This successfully prevents damage to each of the seal rings 204 and allows the seal ring 204 to retain the function of preventing the ingression of moisture, movable ions, or the like into the chip region 202 from outside thereof, which is one of the intrinsic functions of the seal ring 204. As a result, it becomes possible to fabricate a semiconductor device with high reliability.

According to the present embodiment, the individual components of each of the stress absorbing walls 205a and 205b are arranged discretely and independently of each other along the direction in which the seal ring 204 extends. Therefore, even though any of the individual components is damaged and destroyed by the crack or the like during wafer dicing, there is no such situation that the destruction of the stress absorbing wall 205a or 205b is enlarged along the direction in which the seal ring 204 extends. That is, since the individual components of the stress absorbing walls 205a and 205b are independent of each other, it becomes possible to prevent a component adjacent to the destroyed one from coming off as a result of being pulled thereby. By reducing the size (specifically, the length in the direction in which the seal ring 204 extends) of each of the components of the stress absorbing walls 205a and 205b, even though any of the components is destroyed under the influence of the impact, stress, crack, or the like during dicing, only the destroyed component comes off from one of the individual semiconductor devices into which the wafer has been separated (semiconductor chips after dicing). That is, since the damaged component of the stress absorbing wall comes off from the semiconductor chip after dicing without pulling the components, the occurrence of a defective product resulting from the contact between the damaged component of the stress absorbing wall and a bonding wire can be prevented when packaging is performed with respect to the semiconductor chip.

Although the present embodiment has used the multilayer structures consisting of the vias (the buffer vias 231a, 231b, 232a, 232b, 233a, and 233b) as the stress absorbing walls 205a and 205b, it is also possible to use multilayer structures each consisting of vias and wires, which is similar to the multilayer structure of the seal ring 204, instead. Although the present embodiment has used the multilayer structure consisting of the vias (seal vias 221, 223, and 225) and the wires (the seal wires 222, 224, and 226) as the seal ring 204, it is also possible to use a multilayer structure consisting only of vias, which is similar to that of each of the stress absorbing walls 205a and 205b. In the case where the multilayer structure consisting only of the vias is used as each of the seal ring 204 and the stress absorbing walls 205a and 205b, a region in a widthwise direction (direction perpendicular to the direction in which the seal ring 204 extends along the periphery of the chip region 202) occupied by the seal ring 204 and the stress absorbing walls 205a and 205b in the semiconductor device can be reduced compared with the case where the multilayer structure consisting of the vias and the wires is used. This is effective in reducing the size of the semiconductor device.

In the present embodiment, at least one or more of the individual conductors (parts) that have been stacked in layers to compose each of the seal rings 204 are formed preferably in the step of forming the wires having the dual damascene structures. This allows the parts of the seal rings 204 to penetrate through at least one of the interlayer insulating films without leaving seams. That is, by forming the parts of the seal rings 204 in the process of forming the dual damascene wires, the "seams" of each of the seal rings 204 can be reduced in the entire chip region 202 formed with the seal ring, elements such as a transistor, a wiring layer, and the like. As a result, it becomes possible to prevent the ingression of impact that has occurred during wafer dicing or moisture from the outside into the chip region 202.

Although the present embodiment has formed the stress absorbing walls 205a and 205b in the scribe region 203, it is not limited thereto. The same effect is obtainable irrespective of the positions at which the stress absorbing walls 205a and 205b are formed provided that the stress absorbing walls 205a and 205b are interposed between the diced portion of the wafer and the seal ring 204. Specifically, the stress absorbing walls 205a and 205b may also be provided outside the seal ring 204, e.g., in the portions of each of the chip regions 202 which are adjacent to the boundary with the scribe region 203.

Although the present embodiment has provided the seal ring 204 in the portion of each of the chip regions 202 which is adjacent to the boundary with the scribe region 203, the seal ring 204 may also be provided internally of the stress absorbing walls 205a and 205b, e.g., in the portion of the scribe region 203 which remains as the end portion of the semiconductor device (semiconductor chip) even after the dicing (i.e., the portion of the scribe region 203 which is adjacent to the boundary with the chip region 202).

Although the present embodiment has formed the wiring structure in the three interlayer insulating films stacked in layers, the number of the interlayer insulating films stacked in layers is not limited to 3. It will easily be appreciated that the number of the interlayer insulating films stacked in layers may be smaller or larger than 3 depending on the chip structure.

Although the present embodiment has used Cu as a conductive material for constituting each of the seal ring 204 and the stress absorbing walls 205a and 205b, it is not limited thereto. It is also possible to use at least one of W, Al, and Cu to compose each of the seal ring 204 and the stress absorbing walls 205a and 205b. This allows the seal ring 204 and the stress absorbing walls 205a and 205b to be formed from the same material as composing the wires and the vias formed in the chip region 202 of the semiconductor device.

Embodiment 3

An electronic device according to a third embodiment of the present invention and a method for fabricating the same will be described with reference to the drawings.

Figure 23:
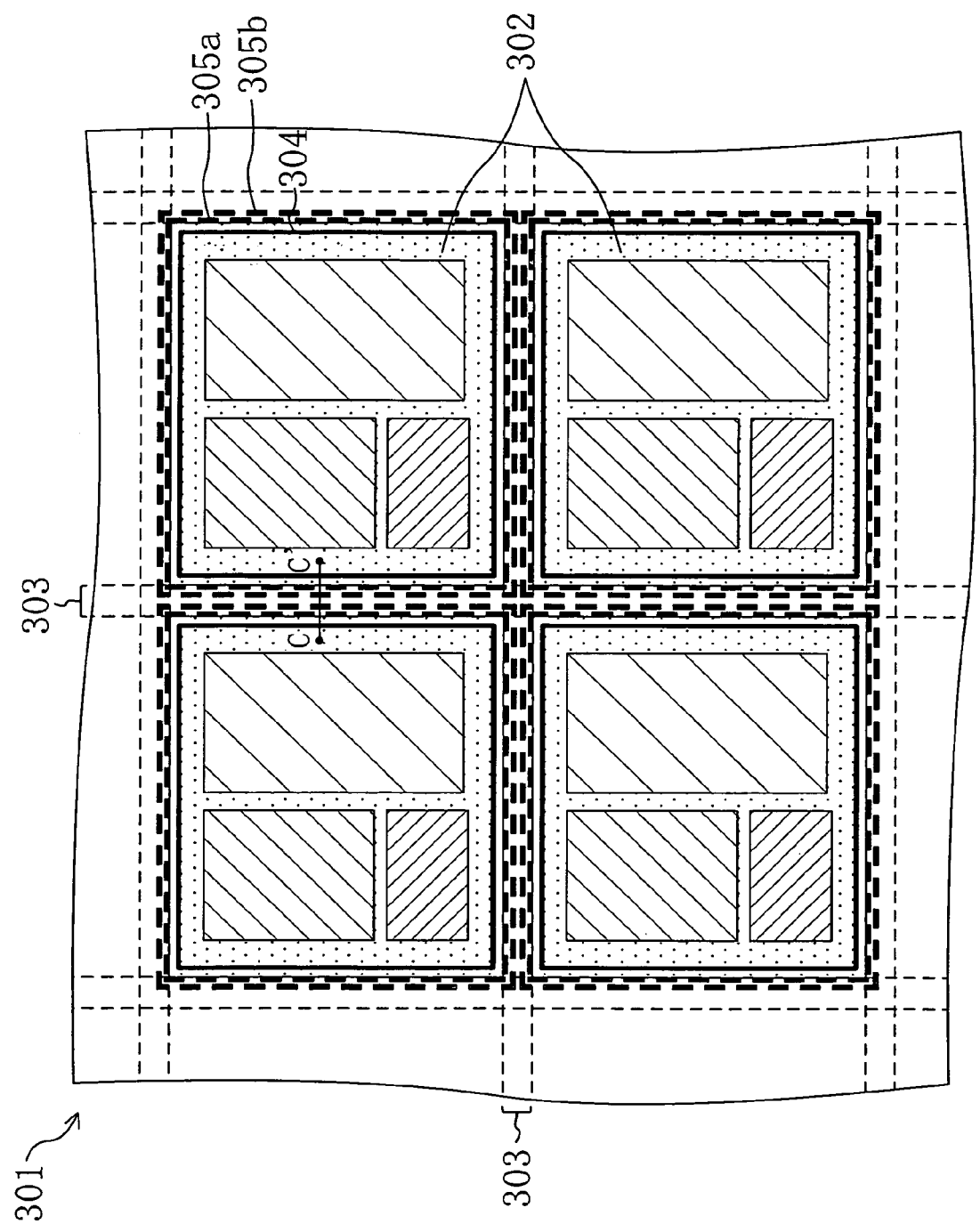
FIG. 23 is a plan view showing a part of a wafer provided with an electronic device according to a third embodiment of the present invention.

FIG. 23 is a plan view showing a part of a wafer provided with an electronic device (a semiconductor device having a seal ring singly surrounding a chip region) according to the third embodiment.

As shown in FIG. 23, a plurality of chip regions 302, each of which is to serve as a semiconductor device, are arranged in a wafer 301 serving as a semiconductor substrate represented by, e.g., a silicon substrate or the like. Each of the chip regions 302 is provided with an IC composed of a plurality of elements and having a specified function. The individual chip regions 302 are defined by scribe regions 303 provided in a grid-like configuration.

Each one of the semiconductor devices (i.e., each one of the semiconductor chips) is comprised herein of: a chip region 302 in which an IC circuit composed of the plurality of elements and having the specified function; a seal ring 304 provided in the peripheral portion of the chip region 302 to surround the chip region 302; and stress absorbing walls 305a and 305b in a double structure according to the present invention which are provided outside the seal ring 304 to discretely surround the seal ring 304. Thus, in the same manner as in the second embodiment, the semiconductor device according to the present embodiment has basically the same structure as the semiconductor device according to the first embodiment except that the stress absorbing walls 305 are in the double structure. In contrast to the semiconductor device according to the second embodiment in which the respective gap portions of the stress absorbing walls 205a and 205b in the double structure are aligned in rows, the respective gap portions of the stress absorbing walls 305a and 305b in the double structure are not aligned in rows in the semiconductor device according to the third embodiment.

In the present embodiment, the stress absorbing walls 305 in a double or higher-order multiple structure, such as a triple or quadruple structure, may also be provided depending on layout margin.

The wafer 301 thus formed with the plurality of semiconductor devices is diced along the scribe regions 303 so that it is separated into the individual semiconductor devices (semiconductor chips). At this time, since the stress absorbing walls 305 are formed in a double or higher-order multiple structure to surround the chip region 302, even though one of the stress absorbing walls (specifically the outer stress absorbing wall 305b) is destroyed by impact, a stress, or the like that has occurred during dicing or a crack resulting therefrom and the impact, stress, or the like propagates inwardly, i.e., toward the inner portion of the chip 302, the other stress absorbing wall (specifically the inner stress absorbing wall 305a) located internally of the destroyed stress absorbing wall absorbs the impact, stress, or the like. This successfully prevents the impact, stress, crack, or the like from reaching and thereby destroying the seal ring 304.

In addition, the stress absorbing walls 305a and 305b in the double structure are formed such that the respective gap portions thereof are not aligned in rows. When the seal ring 304 and the chip region 302 are viewed from the diced portion of the wafer, therefore, the respective portions composing the stress absorbing walls 305a and 305b are arranged with no space therebetween to form a whole entity. This allows the inner stress absorbing wall 305a to reliably absorb the impact, stress, crack, or the like that has occurred during dicing and propagated toward the chip region 302 through the discrete portions of the outer stress absorbing wall 305b. As a result, it becomes possible to prevent damage to the seal ring 304 and the chip region 302 in the step of dividing the wafer 301 into semiconductor chips and thereby prevent the degradation of the performance of each of the semiconductor chips.

Figure 24:
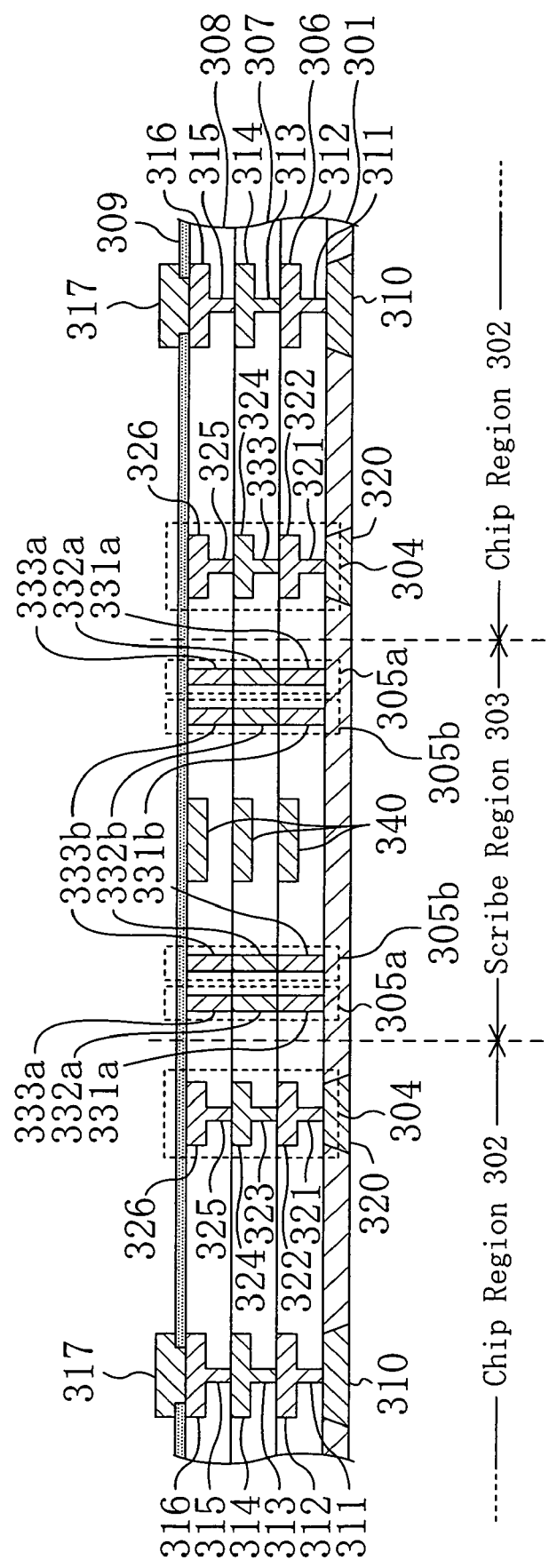
FIG. 24 is a cross-sectional view taken along the line C-C' of FIG. 23.
Figure 25:
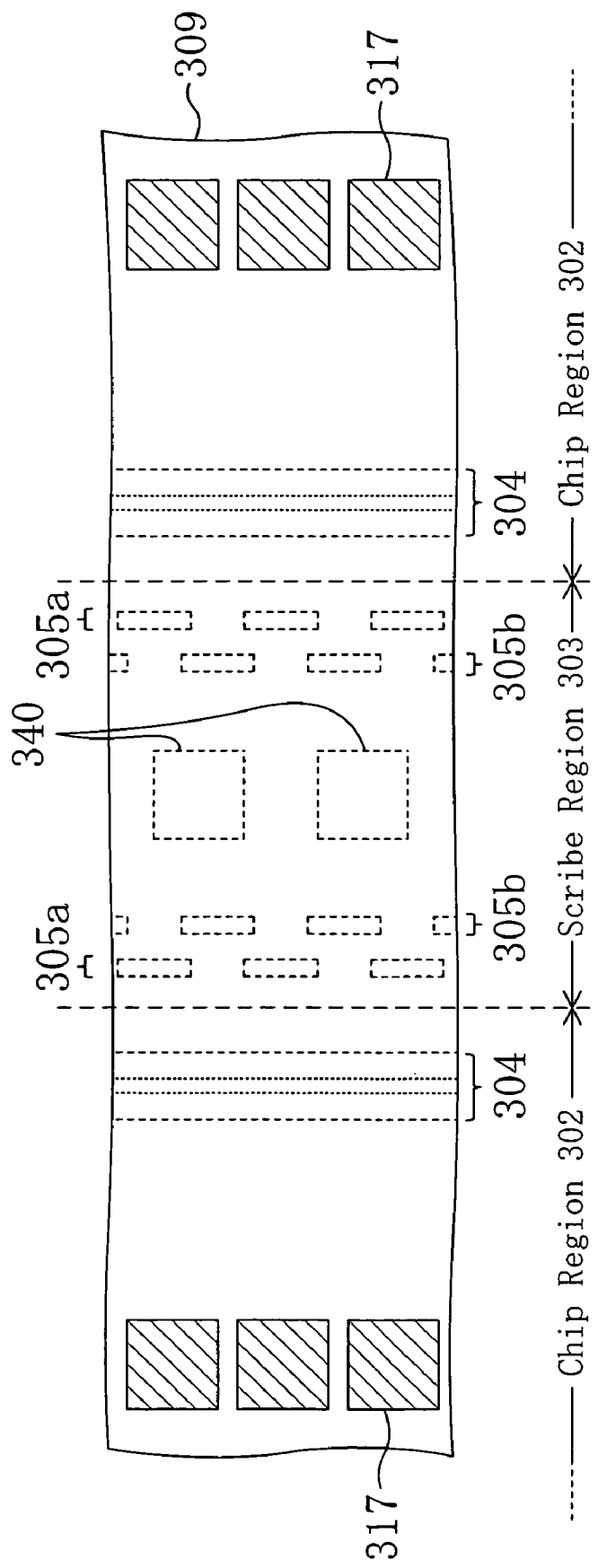
FIG. 25 is a plan view obtained by enlarging the vicinity of the line C-C' of FIG. 23.

FIG. 24 is a cross-sectional view (cross-sectional view of the end portions of the semiconductor devices including seal ring portions positioned in the peripheral portions of the chip regions 302 and, more specifically, of wiring structures in the chip regions 302 and the structures of the seal rings 304) taken along the line C-C' of FIG. 23. FIG. 25 is a plan view obtained by enlarging the vicinity of the line C-C' of FIG. 23. Each of FIGS. 24 and 25 shows the respective end portions of the pair of chip regions 302 with the scribe region 303 interposed therebetween. FIG. 24 shows a cross-sectional structure at a position where the respective portions composing the stress absorbing walls 305a and 305b in the double structure are partly aligned horizontally. Since the respective gap portions of the stress absorbing walls 305a and 305b in the double structure are not aligned in rows in the present embodiment, at least one of the portions composing the stress absorbing wall 305a and the portions composing the stress absorbing wall 305b is observed in a cross-sectional structure taken at any position in the stress absorbing wall formation regions.

As shown in FIGS. 24 and 25, each of the semiconductor devices prior to dicing is composed of the chip region 302 and the scribe region 303. The seal ring 304 is formed in the portion of the chip region 302 which is adjacent to the boundary with the scribe region 303, while stress absorbing walls 305a and 305b in the double structure are formed outside the seal ring 304 (in the portions of the scribe region 303 which are adjacent to the chip regions 302).

As shown in FIG. 24, active layers 310 composing elements such as a transistor are formed in the chip regions 302 of a wafer 301 (hereinafter referred to as the substrate 301), while conductive layers 320 similarly constituted to the active layers 310 are formed in the peripheral portions (seal ring formation regions adjacent to the scribe region 303) of the chip regions 302 of the substrate 301. A first interlayer insulating film 306 is formed on the substrate 301 and first vias 331 connecting to the active layers 310 and first wires 312 connecting to the first vias 331 (i.e., dual damascene wires composed of the first vias 311 and the first wires 312) are formed in the portions of the first interlayer insulating film 306 located in the chip regions 302, while first seal vias 321 connecting to the conductive layers 420 and first seal wires 322 connecting to the first seal vias 321 are formed in the portions of the first interlayer insulating film 306 located in the seal ring formation regions. On the other hand, first buffer vias 331a and 331b are formed in the portions of the first interlayer insulating film 306 located in the stress absorbing wall formation regions, while an accessory wire 340 is formed in the portion of the first interlayer insulating film 306 located in the scribe region 303.

As also shown in FIG. 24, a second interlayer insulating film 307 is formed on the first interlayer insulating film 306 and second vias 313 connecting to the first wires 312 and second wires 314 connecting to the second vias 313 (i.e., dual damascene wires composed of the second vias 313 and the second wires 314) are formed in the portions of the second interlayer insulating film 307 located in the chip regions 302, while second seal vias 323 connecting to the first seal wires 322 and second seal wires 324 connecting to the second seal vias 323 are formed in the portions of the second interlayer insulating film 307 located in the seal ring formation regions. On the other hand, second buffer vias 332a and 332b connecting to the respective first buffer vias 331a and 331b are formed in the portions of the second interlayer insulating film 307 located in the stress absorbing wall formation regions, while the accessory wire 340 is formed in the portion of the second interlayer insulating film 307 located in the scribe region 303.

As also shown in FIG. 24, a third interlayer insulating film 308 is formed on the second interlayer insulating film 307 and third vias 315 connecting to the second wires 314 and third wires 316 connecting to the third vias 315 (i.e., dual damascene wires composed of the third vias 315 and the third wires 316) are formed in the portions of the third interlayer insulating film 308 located in the chip regions 302, while third seal vias 325 connecting to the second seal wires 324 and third seal wires 326 connecting to the third seal vias 325 are formed in the portions of the third interlayer insulating film 308 located in the seal ring formation regions. On the other hand, third buffer vias 333a and 333b connecting to the second buffer vias 332a and 332b are formed in the portions of the third interlayer insulating film 308 located in the stress absorbing wall formation regions, while the accessory wire 340 is formed in the portion of the third interlayer insulating film 308 located in the scribe region 303.

The present embodiment has provided the dual damascene structures composed of the vias or the seal vias and the wires or the seal wires by using Cu in each of the interlayer insulating films. However, it is also possible to provide the vias and the seal vias by using W in the first-layer (lowermost-layer) interlayer insulating film, provide the wires and the seal wires (the lowermost-layer wires and seal wires) by using Cu in the second-layer interlayer insulating film, and provide the dual damascene structures composed of the vias or the seal vias and the wires or the seal wires by using Cu in each of the third- and higher-order-layer interlayer insulating films instead.

As shown in FIG. 24, a passivation film 309 is further deposited on the third interlayer insulating film 308 serving as the uppermost wiring layer to serve as a protective film therefor. In addition, openings corresponding to the third wires 316 are formed locally in the passivation film 309 and pad electrodes 317 connecting to the third wires 316 are formed in the openings.

The method for fabricating the semiconductor device having the structure shown in FIGS. 23 to 25 according to the present embodiment is basically the same as the method for fabricating the semiconductor device according to the second embodiment shown in FIGS. 19 to 22, except for the layout of a mask pattern for forming the stress absorbing walls in the double structure in a photo mask in use.

Thus, according to the present embodiment, the seal rings 304 composed of the seal vias 321, 323, and 325 and the seal wires 322, 324, and 326 are formed simultaneously with the formation of the vias 311, 313, and 315 and the wires 312, 314, and 316 in the chip regions 302. In addition, the stress absorbing walls 305a each having a multilayer structure consisting of the buffer vias 331a, 332a, and 333a and the stress absorbing walls 305b each having a multilayer structure consisting of the buffer vias 331b, 332b, and 333b, i.e., the stress absorbing walls 305 each having the double structure can be formed outside the seal rings 304.

The wafer 301 thus formed with the semiconductor devices in accordance with the method described above is diced along the scribe regions 303 and thereby separated into the individual semiconductor devices (semiconductor chips). At this time, impact, a stress, a crack resulting therefrom, or the like occurs first in the diced portion to propagate toward each of the chip regions 302. At this time, even though the outer stress absorbing wall 305b is destroyed by the impact, stress, crack, or the like and the impact or the like propagates toward the inner portion of the chip region 302, the impact, stress, crack, or the like is absorbed by the stress absorbing wall 305a located internally of the destroyed stress absorbing wall 305b so that the further propagation of the impact or the like toward the inner portion of the chip region 302 is prevented successfully. This successfully prevents damage to each of the seal rings 304 and allows the seal ring 304 to retain the function of preventing the ingression of moisture, movable ions, or the like into the chip region 302 from outside thereof, which is one of the intrinsic functions of the seal ring 304. As a result, it becomes possible to fabricate a semiconductor device with high reliability.

According to the present embodiment, the stress absorbing walls 305a and 305b in the double structure are formed such that the respective gap portions thereof are not aligned in rows. When the seal ring 304 and the chip region 302 are viewed from the diced portion of the wafer, therefore, the respective portions composing the stress absorbing walls 305a and 305b are arranged with no space therebetween to form a whole entity. This allows the inner stress absorbing wall 305a to reliably absorb the impact stress, crack, or the like that has occurred during dicing and propagated toward the chip region 302 through the discrete portions of the outer stress absorbing wall 305b. As a result, damage to the seal ring 304 can be prevented and the seal ring 304 is allowed to retain the function of preventing the ingression of moisture, movable ions, or the like into the chip region 302 from outside thereof, which is one of the intrinsic functions of the seal ring 304. Accordingly, it becomes possible to provide a semiconductor device with high reliability.

Although the present embodiment has used the multilayer structures consisting of the vias (the buffer vias 331a, 331b, 332a, 332b, 333a, and 333b) as the stress absorbing walls 305a and 305b, it is also possible to use multilayer structures each consisting of vias and wires, which is similar to the multiple structure of the seal ring 304, instead. Although the present embodiment has used the multilayer structure consisting of the vias (seal vias 321, 323, and 325) and the wires (the seal wires 322, 324, and 326) as the seal ring 304, it is also possible to use a multilayer structure consisting only of vias, which is similar to that of each of the stress absorbing walls 305a and 305b. In the case where the multilayer structure consisting only of the vias is used as each of the seal ring 304 and the stress absorbing walls 305a and 305b, a region in a widthwise direction (direction perpendicular to the direction in which the seal ring 304 extends along the periphery of the chip region 302) occupied by the seal ring 304 and the stress absorbing walls 305a and 305b in the semiconductor device can be reduced compared with the case where the multilayer structure consisting of the vias and the wires is used. This is effective in reducing the size of the semiconductor device.

In the present embodiment, at least one or more of the individual conductors (parts) that have been stacked in layers to compose each of the seal rings 304 are formed preferably in the step of forming the wires having the dual damascene structures. This allows the parts of the seal rings 304 to penetrate through at least one of the interlayer insulating films without leaving seams. That is, by forming the parts of the seal rings 304 in the process of forming the dual damascene wires, the "seams" of each of the seal rings 304 can be reduced in the entire chip region 302 formed with the seal ring, elements such as a transistor, a wiring layer, and the like. As a result, it becomes possible to prevent the ingression of impact that has occurred during wafer dicing or moisture from the outside into the chip region 302.

Although the present embodiment has formed the stress absorbing walls 305a and 305b in the scribe region 303, it is not limited thereto. The same effect is obtainable irrespective of the positions at which the stress absorbing walls 305a and 305b are formed provided that the stress absorbing walls 305a and 305b are interposed between the diced portion of the wafer and the seal ring 304. Specifically, the stress absorbing walls 305a and 305b may also be provided outside the seal ring 304, e.g., in the portions of each of the chip regions 302 which are adjacent to the boundary with the scribe region 303.

Although the present embodiment has provided the seal ring 304 in the portion of each of the chip regions 302 which is adjacent to the boundary with the scribe region 303, the seal ring 304 may also be provided internally of the stress absorbing walls 305a and 305b, e.g., in the portion of the scribe region 303 which remains as the end portion of the semiconductor device (semiconductor chip) even after the dicing (i.e., the portion of the scribe region 303 which is adjacent to the boundary with the chip region 302).

Although the present embodiment has formed the wiring structure in the three interlayer insulating films stacked in layers, the number of the interlayer insulating films stacked in layers is not limited to 3. It will easily be appreciated that the number of the interlayer insulating films stacked in layers may be smaller or larger than 3 depending on the chip structure.

Although the present embodiment has used Cu as a conductive material for constituting each of the seal ring 304 and the stress absorbing walls 305a and 305b, it is not limited thereto. It is also possible to use at least one of W, Al, and Cu to compose each of the seal ring 304 and the stress absorbing walls 305a and 305b. This allows the seal ring 304 and the stress absorbing walls 305a and 305b to be formed from the same material as composing the wires and the vias formed in the chip region 302 of the semiconductor device.

Embodiment 4

An electronic device according to a fourth embodiment of the present invention and a method for fabricating the same will be described with reference to the drawings.

Figure 26:
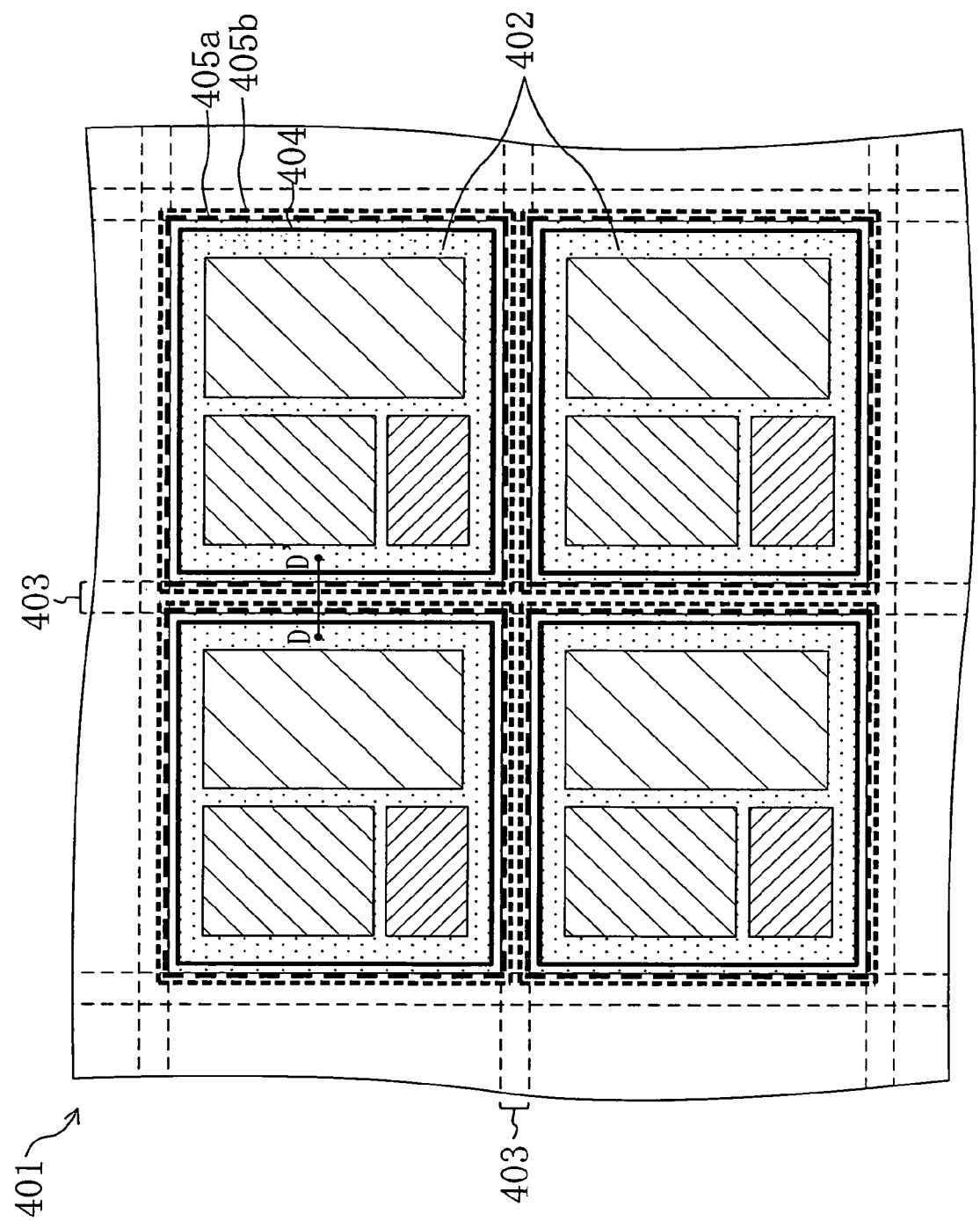
FIG. 26 is a plan view showing a part of a wafer provided with an electronic device according to a fourth embodiment of the present invention.

FIG. 26 is a plan view showing a part of a wafer provided with an electronic device (a semiconductor device having a seal ring singly surrounding a chip region) according to the fourth embodiment.

As shown in FIG. 26, a plurality of chip regions 402, each of which is to serve as a semiconductor device, are arranged in a wafer 401 serving as a semiconductor substrate represented by, e.g., a silicon substrate or the like. Each of the chip regions 402 is provided with an IC composed of a plurality of elements and having a specified function. The individual chip regions 402 are defined by scribe regions 403 provided in a grid-like configuration.

Each one of the semiconductor devices (i.e., each one of the semiconductor chips) is comprised herein of: a chip region 402 in which an IC circuit composed of the plurality of elements and having the specified function; a seal ring 404 provided in the peripheral portion of the chip region 402 to surround the chip region 402; and stress absorbing walls 405a and 405b in a double structure according to the present invention which are provided outside the seal ring 404 to discretely surround the seal ring 404. Thus, in the same manner as in the second or third embodiment, the semiconductor device according to the present embodiment has basically the same structure as the semiconductor device according to the first embodiment except that the stress absorbing walls 205 are in the double structure. A characteristic feature peculiar to the semiconductor device according to the present embodiment is that, in the stress absorbing walls 405a and 405b in the double structure, each of the components of the outer stress absorbing wall 405b is shorter in length along a direction in which the seal ring 404 extends than each of the components of the inner stress absorbing wall 405a.

In the present embodiment, the stress absorbing walls 405 in a double or higher-order multiple structure, such as a triple or quadruple structure, may also be provided depending on layout margin. In this case, each of the components of the stress absorbing wall 405 in a double or higher-order multiple structure which is formed at a position most distant from the seal ring 404 is shorter in length along directions in which the seal rings 404 extend than each of the components of the other stress absorbing wall or walls 405.

A wafer 401 thus formed with the plurality of semiconductor devices is diced along the scribe regions 403 so that it is separated into the individual semiconductor devices (semiconductor chips). At this time, since the stress absorbing walls 405 are formed in a double or higher-order multiple structure to surround the chip region 402, even though one of the stress absorbing walls (specifically the outer stress absorbing wall 405b) is destroyed by impact, a stress, or the like that has occurred during dicing or a crack resulting therefrom and the impact, stress, or the like propagates inwardly, e.g., toward the inner portion of the chip 402, the other stress absorbing wall (specifically the inner stress absorbing wall 405a) located internally of the destroyed stress absorbing wall absorbs the impact, stress, or the like. This successfully prevents the impact, stress, crack, or the like from reaching and thereby destroying the seal ring 404.

In addition, since each of the components of the stress absorbing wall 405b at a position closest to the diced portion of the wafer, i.e., of the stress absorbing wall 405b formed at a position most distant from the seal ring 404 is smaller in length, a crack, impact, or the like that has occurred during dicing can be finely distributed and absorbed. As a result, it becomes possible to prevent damage to the seal ring 404 and the chip region 402 when the wafer 401 is divided into individual semiconductor chips and thereby prevent the degradation of the performance of each of the semiconductor chips. Since each of the components of the stress absorbing wall 405b is smaller in size, even though the component receives a crack, impact, or the like during dicing and is destroyed thereby, the component easily comes off from the semiconductor device (one of the individual semiconductor chips into which the wafer has been separated). This prevents a situation where the destroyed component is left protruding from the end portion of the semiconductor chip after dicing and thereby eliminates a defective product resulting from the contact between the residue of the stress absorbing wall 405b and a bonding wire when packaging is performed with respect to the semiconductor chip.

Figure 27:
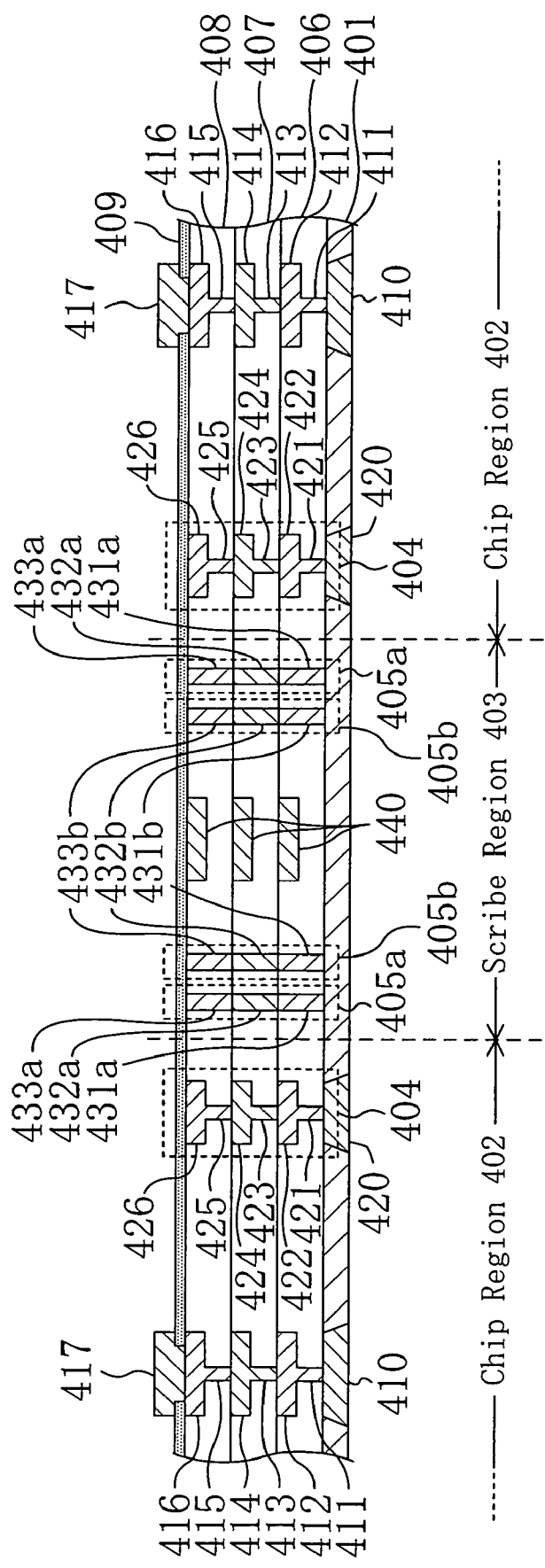
FIG. 27 is a cross-sectional view taken along the line D-D' of FIG. 26.
Figure 28:
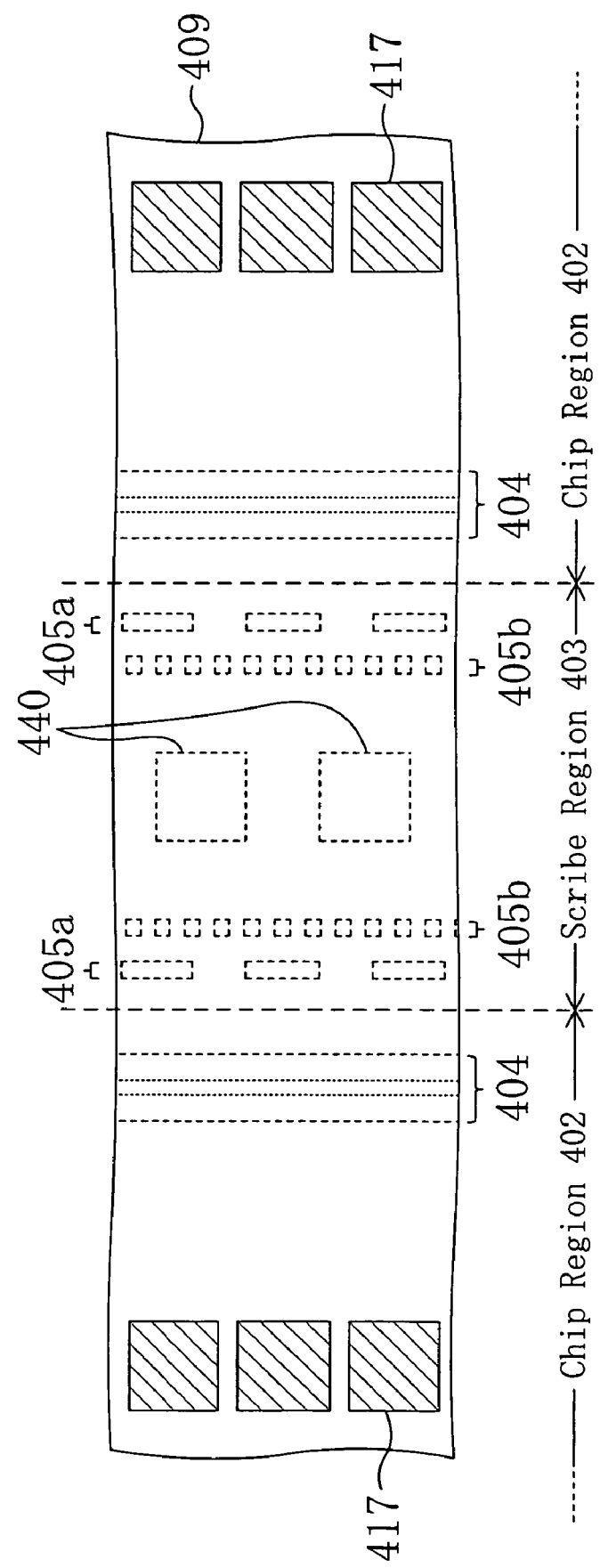
FIG. 28 is a plan view obtained by enlarging the vicinity of the line D-D' of FIG. 26.

FIG. 27 is a cross-sectional view (cross-sectional view of the end portions of the semiconductor devices including seal ring portions positioned in the peripheral portion of the chip regions 402 and, more specifically, of wiring structures in the chip regions 402 and the structures of the seal rings 404) taken along the line D-D' of FIG. 26. FIG. 28 is a plan view obtained by enlarging the vicinity of the line D-D' of FIG. 26. Each of FIGS. 27 and 28 shows the respective end portions of the pair of chip regions 402 with the scribe region 403 interposed therebetween. FIG. 27 shows a cross-sectional structure at a position where the respective portions composing the stress absorbing walls 305a and 305b in the double structure are partly aligned horizontally.

As shown in FIGS. 27 and 28, each of the semiconductor devices prior to dicing is composed of the chip region 402 and the scribe region 403. The seal ring 404 is formed in the portion of the chip region 402 which is adjacent to the boundary with the scribe region 303, while stress absorbing walls 405a and 405b in the double structure are formed outside the seal ring 404 (in the portions of the scribe region 403 which are adjacent to the chip regions 402).

As shown in FIG. 27, active layers 410 composing elements such as a transistor are formed in the chip regions 402 of a wafer 401 (hereinafter referred to as the substrate 301), while conductive layers 420 similarly constituted to the active layers 410 are formed in the peripheral portions of the chip regions 402 of the substrate 401. A first interlayer insulating film 406 is formed on the substrate 301 and first vias 431 connecting to the active layers 410 and first wires 412 connecting to the first vias 431 (i.e., dual damascene wires composed of the first vias 411 and the first wires 412) are formed in the portions of the first interlayer insulating film 406 located in the chip regions 402, while first seal vias 421 connecting to the conductive layer 420 and first seal wires 422 connecting to the first seal vias 421 are formed in the portions of the first interlayer insulating film 406 located in the seal ring formation regions. On the other hand, first buffer vias 431a and 431b are formed in the portions of the first interlayer insulating film 406 located in the stress absorbing wall formation regions, while an accessory wire 440 is formed in the portion of the first interlayer insulating film 406 located in the scribe region 403.

As also shown in FIG. 27, a second interlayer insulating film 407 is formed on the first interlayer insulating film 406 and second vias 413 connecting to the first wires 412 and second wires 414 connecting to the second vias 413 (i.e., dual damascene wires composed of the second vias 413 and the second wires 414) are formed in the portions of the second interlayer insulating film 407 located in the chip regions 402, while second seal vias 423 connecting to the first seal wires 422 and second seal wires 424 connecting to the second seal vias 423 are formed in the portions of the second interlayer insulating film 407 located in the seal ring formation regions. On the other hand, second buffer vias 432a and 432b connecting to the respective first buffer vias 431a and 431b are formed in the portions of the second interlayer insulating film 407 located in the stress absorbing wall formation regions, while the accessory wire 440 is formed in the portion of the second interlayer insulating film 407 located in the scribe region 403.

As also shown in FIG. 27, a third interlayer insulating film 408 is formed on the second interlayer insulating film 407 and third vias 415 connecting to the second wires 314 and third wires 416 connecting to the third vias 415 (i.e., dual damascene wires composed of the third vias 415 and the third wires 416) are formed in the portions of the third interlayer insulating film 408 located in the chip regions 402, while third seal vias 425 connecting to the second seal wires 424 and third seal wires 426 connecting to the third seal vias 425 are formed in the portions of the third interlayer insulating film 408 located in the seal ring formation regions. On the other hand, third buffer vias 433a and 433b connecting to the second buffer vias 432a and 432b are formed in the portions of the third interlayer insulating film 408 located in the stress absorbing wall formation regions, while the accessory wire 440 is formed in the portion of the third interlayer insulating film 408 located in the scribe region 403.

The present embodiment has provided the dual damascene structures composed of the vias or the seal vias and the wires or the seal wires by using Cu in each of the interlayer insulating films. However, it is also possible to provide the vias and the seal vias by using W in the first-layer (lowermost-layer) interlayer insulating film, provide the wires and the seal wires (the lowermost-layer wires and seal wires) by using Cu in the second-layer interlayer insulating film, and provide the dual damascene structures composed of the vias or the seal vias and the wires or the seal wires by using Cu in each of the third- and higher-order-layer interlayer insulating films instead.

As shown in FIG. 27, a passivation film 409 is further deposited on the third interlayer insulating film 408 serving as the uppermost wiring layer to serve as a protective film therefor. In addition, openings corresponding to the third wires 416 are formed locally in the passivation film 409 and pad electrodes 417 connecting to the third wires 416 are formed in the openings.

The method for fabricating the semiconductor device having the structure shown in FIGS. 26 to 28 according to the present embodiment is basically the same as the method for fabricating the semiconductor device according to the second embodiment shown in FIGS. 19 to 22, except for the layout of a mask pattern for forming the stress absorbing walls in the double structure in a photo mask in use.

Thus, according to the present embodiment, the seal rings 404 composed of the seal vias 421, 423, and 425 and the seal wires 422, 424, and 426 are formed simultaneously with the formation of the vias 411, 413, and 415 and the wires 412, 414, and 416 in the chip regions 402. In addition, the stress absorbing walls 405 each having a multilayer structure consisting of the buffer vias 431a, 432a, and 433a and the stress absorbing walls 305b each having a multilayer structure consisting of the buffer vias 431b, 432b, and 433b, i.e., the stress absorbing walls 405 each having the double structure can be formed outside the seal rings 404.

The wafer 401 thus formed with the semiconductor devices in accordance with the method described above is diced along the scribe regions 403 and thereby separated into the individual semiconductor devices (semiconductor chips). At this time, impact, a stress, a crack resulting therefrom, or the like occurs first in the diced portion to propagate toward each of the chip regions 402. At this time, even though the outer stress absorbing wall 405b is destroyed by the impact, stress, crack, or the like and the impact or the like propagates toward the inner portion of the chip region 402, the impact, stress, crack, or the like is absorbed by the stress absorbing wall 405a located internally of the destroyed stress absorbing wall 405b so that the further propagation of the impact or the like toward the inner portion of the chip region 402 is prevented successfully. This successfully prevents damage to the seal ring 404 and allows the seal ring 404 to retain the function of preventing the ingression of moisture, movable ions, or the like into the chip region 402 from outside thereof, which is one of the intrinsic functions of the seal ring 404. As a result, it becomes possible to fabricate a semiconductor device with high reliability.

According to the present embodiment, in the stress absorbing walls 405a and 405b in the double structure, the stress absorbing wall 405b is at a position closest to the diced portion of a wafer, i.e., formed at a position at most distant from the seal ring 404. Since each of the components of the stress absorbing wall 405b is smaller in length, a crack, impact, or the like that has occurred during dicing can be finely distributed and absorbed. As a result, it becomes possible to prevent damage to the seal ring 404 and the chip region 402 when the wafer 401 is divided into individual semiconductor chips and thereby prevent the degradation of the performance of each of the semiconductor chips. Since each of the components of the stress absorbing wall 405b is smaller in size, even though the component receives a crack, impact, or the like during dicing and is destroyed thereby, the component easily comes off from the semiconductor device (one of the individual semiconductor chips into which the wafer has been separated). This prevents a situation where the destroyed component is left protruding from the end portion of the semiconductor chip after dicing and thereby eliminates a defective product resulting from the contact between the residue of the stress absorbing wall 405b and a bonding wire when packaging is performed with respect to the semiconductor chip.

Although the present embodiment has used the multilayer structures consisting of the vias (the buffer vias 431a, 431b, 432a, 432b, 433a, and 433b) as the stress absorbing walls 405a and 405b, it is also possible to use multilayer structures each consisting of vias and wires, which is similar to the multilayer structure of the seal ring 404, instead. Although the present embodiment has used the multilayer structure consisting of the vias (seal vias 421, 423, and 425) and the wires (the seal wires 422, 424, and 426) as the seal ring 404, it is also possible to use a multilayer structure consisting only of vias, which is similar to that of each of the stress absorbing walls 405a and 405b. In the case where the multilayer structure consisting only of the vias is used as each of the seal ring 404 and the stress absorbing walls 405a and 405b, a region in a widthwise direction (direction perpendicular to the direction in which the seal ring 404 extends along the periphery of the chip region 402) occupied by the seal ring 404 and the stress absorbing walls 405a and 405b in the semiconductor device can be reduced compared with the case where the multilayer structure consisting of the vias and the wires is used. This is effective in reducing the size of the semiconductor device.

In the present embodiment, at least one or more of the individual conductors (parts) that have been stacked in layers to compose each of the seal rings 404 are formed preferably in the step of forming the wires having the dual damascene structures. This allows the parts of the seal rings 404 to penetrate through at least one of the interlayer insulating films without leaving seams. That is, by forming the parts of the seal rings 404 in the process of forming the dual damascene wires, the "seams" of each of the seal rings 404 can be reduced in the entire chip region 402 formed with the seal ring, elements such as a transistor, a wiring layer, and the like. As a result, it becomes possible to prevent the ingression of impact that has occurred during wafer dicing or moisture from the outside into the chip region 402.

Although the present embodiment has formed the stress absorbing walls 405a and 405b in the scribe region 403, it is not limited thereto. The same effect is obtainable irrespective of the positions at which the stress absorbing walls 405a and 405b are formed provided that the stress absorbing walls 405a and 405b are interposed between the diced portion of the wafer and the seal ring 404. Specifically, the stress absorbing walls 405a and 405b may also be provided outside the seal ring 404, e.g., in the portions of each of the chip region 402 which are adjacent to the boundary with the scribe region 403.

Although the present embodiment has provided the seal ring 404 in the portion of each of the chip regions 402 which is adjacent to the boundary with the scribe region 403, the seal ring 404 may also be provided internally of the stress absorbing walls 405a and 405b, e.g., in the portion of the scribe region 403 which remains as the end portion of the semiconductor device (semiconductor chip) even after the dicing (i.e., the portion of the scribe region 403 which is adjacent to the boundary with the chip region 402).

Although the present embodiment has formed the wiring structure in the three interlayer insulating films stacked in layers, the number of the interlayer insulating films stacked in layers is not limited to 3. It will easily be appreciated that the number of the interlayer insulating films stacked in layers may be smaller or larger than 3 depending on the chip structure.

Although the present embodiment has used Cu as a conductive material for constituting each of the seal ring 404 and the stress absorbing walls 405a and 405b, it is not limited thereto. It is also possible to use at least one of W, Al, and Cu to compose each of the seal ring 404 and the stress absorbing walls 405a and 405b. This allows the seal ring 404 and the stress absorbing walls 405a and 405b to be formed from the same material as composing the wires and the vias formed in the chip region 402 of the semiconductor device.

A description will be given herein below to variations of the seal ring structure in each of the embodiments of the present invention by using the seal ring 104 according to the first embodiment as an example. However, the same shall apply to the seal rings 204, 304, and 404 according to the other embodiments.

FIGS. 29A to 29F show the respective cross-sectional structures of the variations of the seal ring structure in each of the embodiments of the present invention. FIGS. 30A to 30C and FIGS. 31A to 31C show the plan structures of the variations of the seal ring structure in each of the embodiments of the present invention. In FIGS. 30A to 30C and FIGS. 31A to 31C, the seal rings 104 are indicated by the bold solid lines.

Figure 29A:
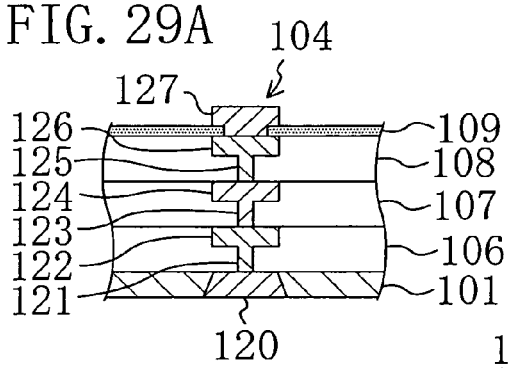
FIGS. 29A to 29F are cross-sectional views of variations of a seal ring structure according to each of the embodiments of the present invention.

The characteristic feature of the seal ring structure shown in FIG. 29A is that the passivation film 109 has an opening formed over the third seal wire 126 formed in the uppermost-layer interlayer insulating film (the third interlayer insulating film 108) and a cap layer 127 is provided in the opening. This brings the portion of the passivation film 109 located in the chip region 102 and the portion thereof located outside the seal ring formation region (including the scribe region 103) into discrete relation so that mechanical impact received by the portion of the passivation film 109 which is adjacent to the scribe region 103 during dicing is less likely to be transmitted to the portion of a film such as the passivation film 109 deposited on the chip region 102. That is, since the passivation film 109 is locally discrete in the portion of the chip region 102 which is adjacent to the boundary with the scribe region 103, it becomes possible to prevent the impact that has occurred during wafer dicing from reaching the chip region 102.

Figure 29B:
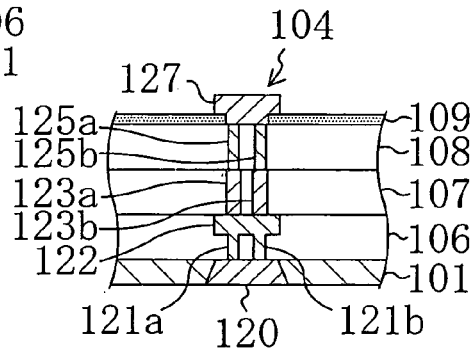

The seal ring structure shown in FIG. 29B is different from the seal ring structure shown in FIG. 29A in that seal vias 121a and 121b each connecting to the conductive layer 120 are provided in the first interlayer insulating film 106 in place of the seal via 121, that seal vias 123a and 123b each connecting to the first seal wire 122 are provided in the second interlayer insulating film 107 in place of the second seal via 123 and the second seal wire 124, and that seal vias 125a and 125b connecting to the seal vias 123a and 123b, respectively, are provided in the third interlayer insulating film 108 in place of the third seal via 125 and the third seal wire 125. Each of the seal vias 121a and 121b has an upper portion thereof connected to the first seal wire 122, while each of the seal vias 125a and 125b has an upper portion thereof connected to the cap layer 127. The seal ring structure shown in FIG. 29B provides the following effect in addition to the effect obtainable from the seal ring structure shown in FIG. 29A. In a seal ring structure, the strength of a seal via is lower than that of a seal wire because the width of the seal via is smaller than that of the seal wire. However, by using a seal via branched into two or more parts, not a single seal via, as a part composing a seal ring as shown in the seal ring structure of FIG. 29B, a multilayer structure of seal rings (a structure multiply surrounding the chip region 102) can be implemented locally in the interlayer insulating film provided with the branched seal vias. Compared with a seal ring having a single seal via (i.e., in a single structure) in a given interlayer insulating film, the strength of the seal ring structure shown in FIG. 29B having the portion in the multiple structure is improved.

Figure 29C:
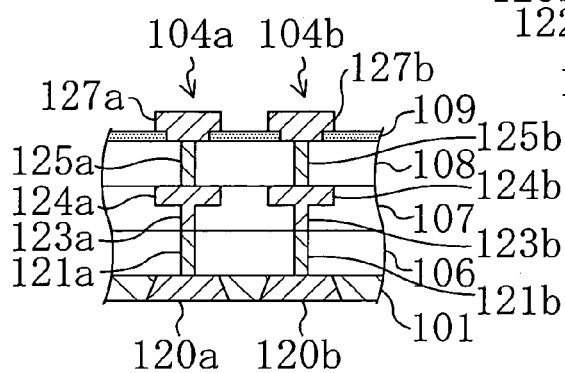

The characteristic feature of the seal ring structure shown in FIG. 29C is that a double seal ring structure composed of a seal ring 104a and a seal ring 104b is provided in the portion of the chip region 102 which is adjacent to the scribe region 103 (i.e., in the seal ring formation region). Specifically, the seal ring 104a is composed of: a conductive layer 120a formed in the substrate 101; a seal via 121a formed in the first interlayer insulating film 106 and connecting to the conductive layer 120a; a seal via 123a formed in the lower portion of the second interlayer insulating film 107 and connecting to the seal via 121a; a seal wire 124a formed in the upper portion of the second interlayer insulating film 107 and connecting to the seal via 123a; and a seal via 125a formed in the third interlayer insulating film 108 and connecting to the seal wire 124a. The seal ring 104b is composed of: a conductive layer 120b formed in the substrate 101; a seal via 121b formed in the first interlayer insulating film 106 and connecting to the conductive layer 120b; a seal via 123b formed in the lower portion of the second interlayer insulating film 107 and connecting to the seal via 121b; a seal wire 124b formed in the upper portion of the second interlayer insulating film 107 and connecting to the seal via 123b; and a seal via 125b formed in the third interlayer insulating film 108 and connecting to the seal wire 124b. The passivation film 109 has respective openings formed over the seal vias 125a and 125b formed in the uppermost-layer interlayer insulating film (the third interlayer insulating film 108) and cap layers 127a and 127b are provided in the respective openings. In the seal ring structure shown in FIG. 29C, seal rings 194a and 104b each continuously surrounding the chip region 102 are formed in a double structure in the peripheral portion of the chip region 102. During dicing, the arrangement can more reliably prevent mechanical impact resulting from the contact between the blade of a dicing system and the scribe line (scribe region) 103 from being applied to the chip region 102 when the semiconductor wafer (substrate) 101 is diced along the scribe region 103 and the individual complete semiconductor chips (semiconductor devices) into which the wafer has been separated are collected therefrom and prevent the chip region 102 from being destroyed thereby. The cap layers 127a and 127b formed in the respective uppermost portions of the seal rings 104a and 104b are provided in the openings of the passivation film 109 each continuously surrounding the chip region 102. Accordingly, the passivation film 109 is doubly divided by the cap layers 127a and 127b into the portion formed in the chip region 102 and the portion formed in the scribe region 103. As a result, there is no such situation that the scribe region 103 and the chip region 102 are connected to each other via the passivation film 109 and, therefore, the impact received by the portion of the passivation film 109 located in the scribe region 103 during dicing is barely propagated to the chip region 102 via the passivation film 109.

Figure 29D:
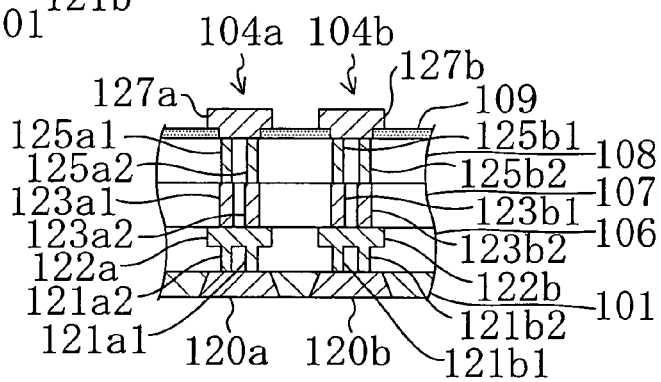

The seal ring structure shown in FIG. 29D is obtained by providing therein the seal ring structure shown in FIG. 29B in a double configuration, similarly to the seal ring structure shown in FIG. 29C. The seal ring structure shown in FIG. 29D can also achieve the same effect as achieved by the seal ring structure shown in FIG. 29B in addition to the same effect as achieved by the seal ring structure shown in FIG. 29C.

Figure 29E:
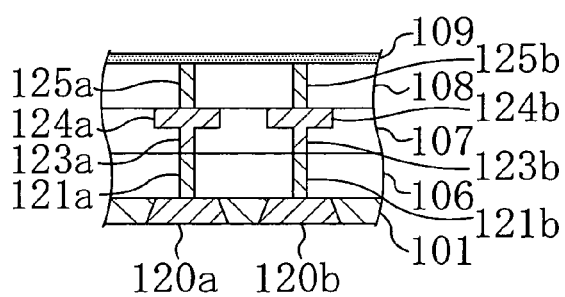

In the seal ring structure shown in FIG. 29C, the openings need not be formed in the passivation film 109 and the cap layers 127a and 127b need not also be provided, as shown in FIG. 29E. It is also possible to provide either one of the cap layers, though it is not depicted.

Figure 29F:
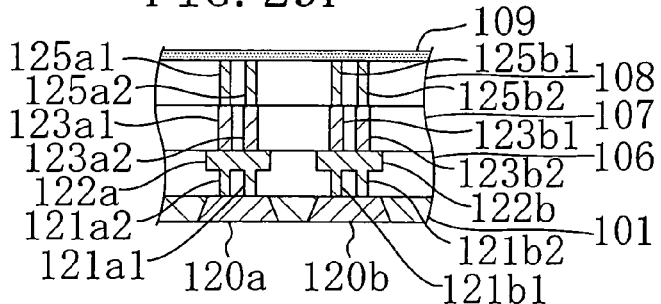

In the seal ring structure shown in FIG. 29D, the openings need not be formed in the passivation film 109 and the cap layers 127a and 127b need not also be provided, as shown in FIG. 29F. It is also possible to provide either one of the cap layers, though it is not depicted.

Figure 30A:
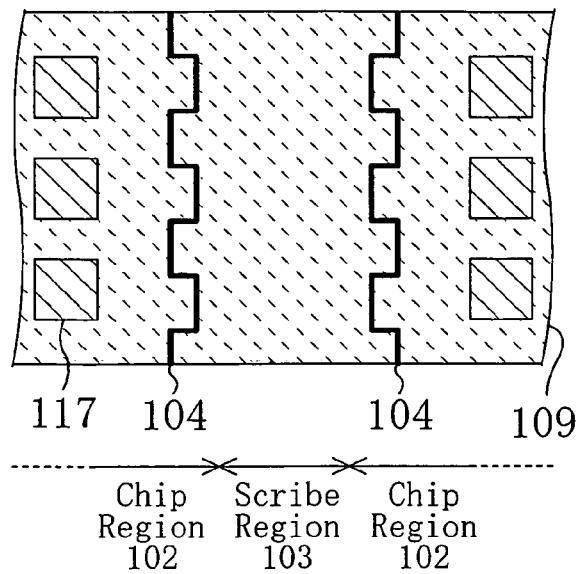
FIGS. 30A to 30C are plan views of variations of the seal ring structure according to each of the embodiments of the present invention.

The characteristic feature of the plan configuration of the seal ring structure shown in FIG. 30A is that the seal ring 104 has rectangular projections/depressions when viewed from above the substrate 101 (i.e., the passivation film 109).

Figure 30B:
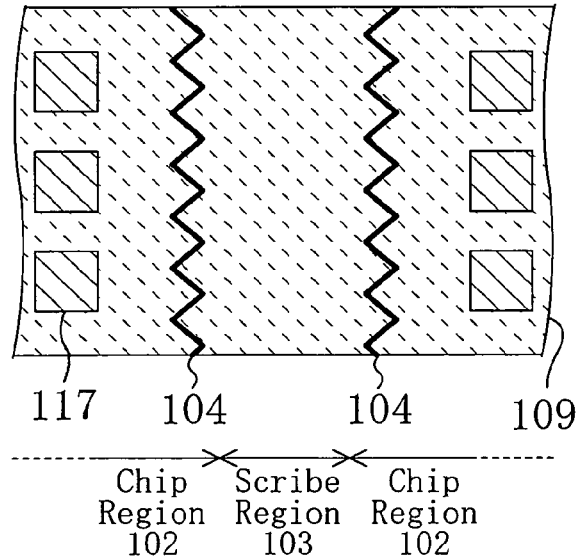

The characteristic feature of the plan configuration of the seal ring structure shown in FIG. 30B is that the seal ring 104 has triangular projections/depressions when viewed from above the substrate 101.

Figure 30C:
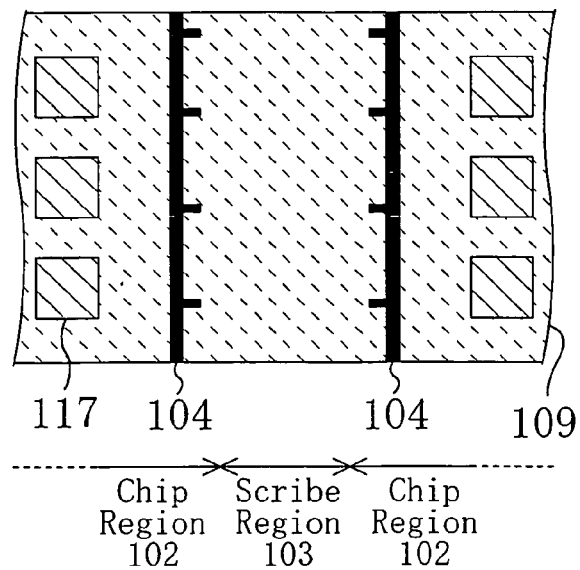

The characteristic feature of the plan configuration of the seal ring structure shown in FIG. 30C is that the side portions of the seal ring 104 is provided with a plurality of projections each extending toward the scribe region 103. In other words, the seal ring 104 has the plurality of projections in directions perpendicular to the direction in which the scribe region 103 extends.

The respective cross-sectional configurations of the semiconductor devices corresponding to FIGS. 30A to 30C are the same as in the first embodiment shown in FIG. 2 or in the above-mentioned variations shown in FIGS. 29A and 29B, except that the position at which the seal ring 104 is formed varies in a horizontal direction or the width of the seal ring 104 varies depending on a position from which the cross section is observed.

In the semiconductor device having the seal ring structure shown in any of FIGS. 30A to 30C, the barrier of each of the seal rings 104 protecting the chip regions 102 is provided not only in a direction parallel to the direction in which the scribe region 103 extends but also in directions perpendicular and oblique thereto. The arrangement can prevent impact and a stress each resulting from the contact between the blade of the dicing system and a film such as the passivation film 109 during wafer dicing, a crack caused thereby in the wafer (substrate 101), and the like from propagating along the side surface (the surface opposing the scribe region 103) of the seal ring 104.

Figure 31A:
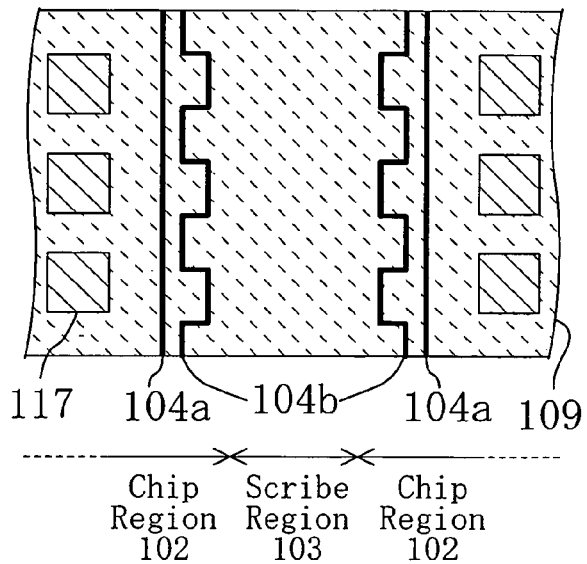
FIGS. 31A to 31C are plan views of variations of the seal ring structure according to each of the embodiments of the present invention.

The characteristic feature of the plan configuration of the seal ring structure shown in FIG. 31A is that the side portion of the seal ring 104 opposing the scribe region 103 has rectangular projections/depressions when viewed from above the substrate 101 (i.e., the passivation film 109).

Figure 31B:
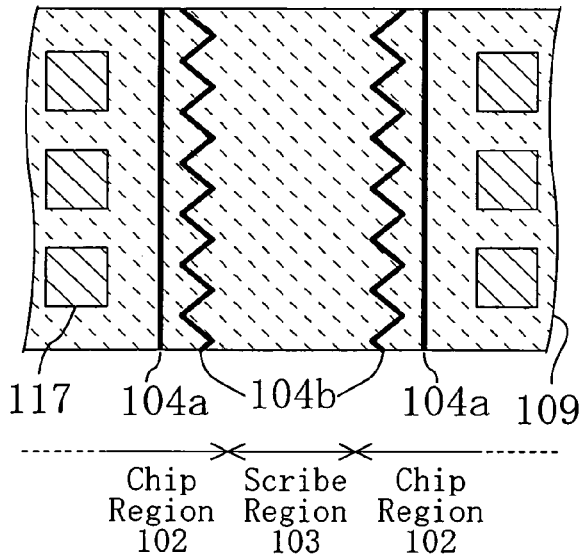

The characteristic feature of the plan configuration of the seal ring structure shown in FIG. 31B is that the side portion of the seal ring 104 opposing the scribe region 103 has triangular projections/depressions when viewed from above the substrate 101.

Figure 31C:
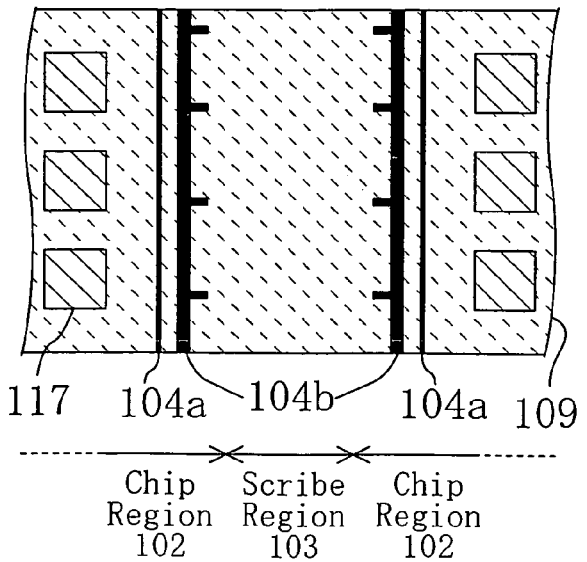
Figure 32:
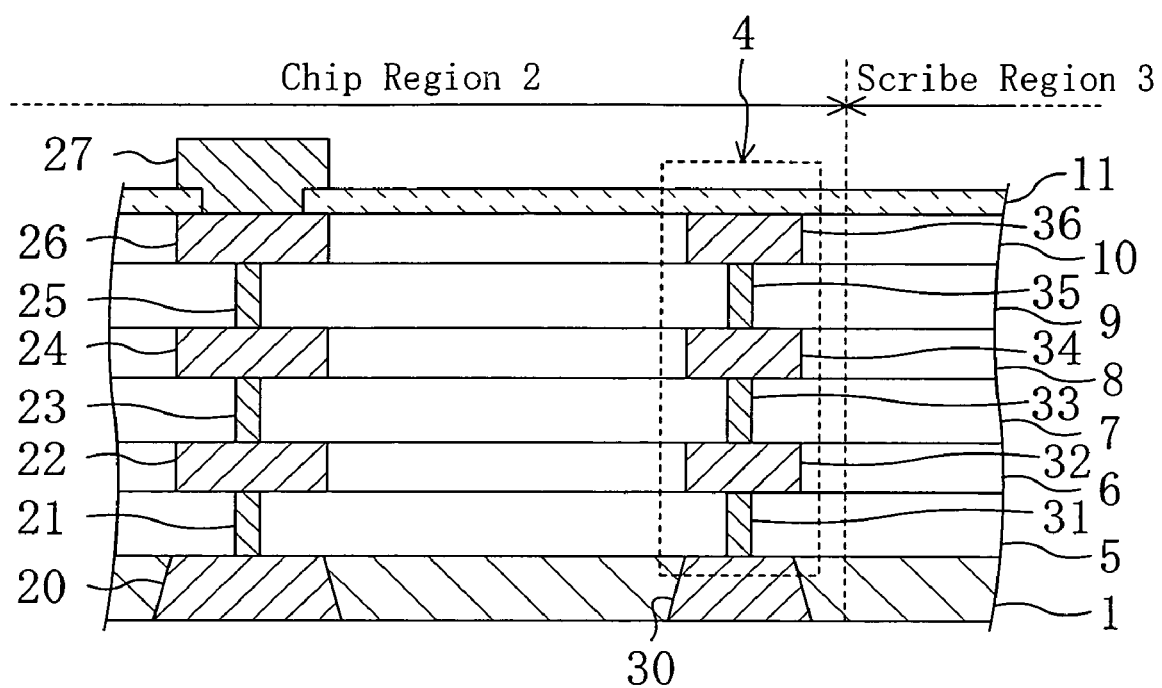
FIG. 32 is a cross-sectional view of a conventional semiconductor device.

The characteristic feature of the plan configuration of the seal ring structure shown in FIG. 31C is that the side portion of the seal ring 104b opposing the scribe region 103 is provided with a plurality of projections each extending toward the scribe region 103. In other words, the seal ring 104b has a plurality of projections in directions perpendicular to the direction in which the scribe region 103 extends.

The respective cross-sectional structures of the semiconductor devices corresponding to FIGS. 31A to 31C are the same as in the above-mentioned variations shown in FIGS. 29C to 29F, except that the position at which the seal ring 104 is formed varies in a horizontal direction or the width of the seal ring 104 varies depending on a position from which the cross section is observed.

The semiconductor device having the seal ring structure according to the present embodiment shown in any of FIGS. 31A to 31C achieves the following effect in addition to the same effect achieved by the double seal ring structure in any of the variations shown in FIGS. 29C to 29F. Of the seal rings 104a and 104b protecting the chip regions 102, each of the seal rings 104b has a barrier opposing the scribe region 103 which is provided not only in a direction parallel to the direction in which the scribe region 103 extends but also in directions perpendicular and oblique thereto. The arrangement can prevent impact and a stress each resulting from the contact between the blade of the dicing system and a film such as the passivation film 109 during wafer dicing, a crack caused thereby in the wafer (substrate 101), and the like from propagating along the side surface (the surface opposing the scribe region 103) of the seal ring 104b.

The description has been given to the combination of the seal ring 104a having a linear plan configuration and the seal ring 104b having a plan configuration other than the linear plan configuration in each of the seal ring structures (double structures) shown in FIGS. 31A to 31C. However, both of the seal rings 104a and 104b may have plan configurations (which may be the same or different from each other) other than the linear configuration. It is also possible to use a seal ring structure in a triple or higher-order multiple configuration, of which at least the outermost seal ring has a plan configuration other than the linear configuration. In the case where a plurality of seal rings having plan configurations other than the linear configuration are used or where a seal ring structure having a triple or higher-order multiple configuration is used, the width ratio of the seal ring portion to the whole semiconductor device (semiconductor chip) may be increased disadvantageously in terms of the size reduction of the semiconductor device. Accordingly, it is preferable to use a double seal ring structure obtained by combining a seal ring having a linear plan configuration with a seal ring having a plan configuration other than the linear plan configuration, such as the seal ring structure shown in each of FIGS. 31A to 31C.

What is claimed is:

1. An electronic device comprising:
   a substrate;
   an element formed in a chip region of the substrate;
   a multilayer structure composed of a plurality of interlayer insulating films formed on the substrate;
   a passivation film formed on the multilayer structure composed of the plurality of interlayer insulating films;
   a first seal ring formed to contact the substrate and to extend through the multilayer structure composed of the plurality of interlayer insulating films which is located in a peripheral portion of the chip region and to continuously surround the chip region; and
   a stress absorbing wall formed to contact the substrate and to extend through the multilayer structure composed of the plurality of interlayer insulating films which is located outside the first seal ring and to discretely surround the first seal ring,
   wherein a second seal ring is provided outside the first seal ring so as to surround the first seal ring,
   the passivation film has an opening on only one of the first seal ring or on the second seal ring and not the other, and
   a cap layer is formed in the opening.

2. The electronic device of claim 1, wherein the stress absorbing walls in a double or higher-order multiple structure are surrounding the seal ring.

3. The electronic device of claim 2, wherein gap portions between respective discrete portions of each of the stress absorbing walls in the double or higher-order multiple structure are not aligned in rows.

4. The electronic device of claim 2, wherein each of components of the one of the stress absorbing walls in the double or higher-order multiple structure which is formed at a position most distant from the seal ring has a shorter length along a direction in which the seal ring extends than each of components of the other stress absorbing wall or walls.

5. The electronic device of claim 1, wherein each of the first seal ring, the second seal ring, and the stress absorbing wall is composed of at least one of W, Al, and Cu.

6. The electronic device of claim 1, wherein
   the stress absorbing wall has a rectangular planar shape, and
   a long side of the stress absorbing wall is provided in a direction parallel to one side of the second seal ring which is located in the nearest position to the stress absorbing wall.

7. The electronic device of claim 1, wherein the second seal ring has a planar shape with a winding in a portion corresponding to one side of the chip region.

8. The electronic device of claim 1, wherein the second seal ring has a planar shape with a projection extending to the opposite side of the chip region in a portion corresponding to one side of the chip region.

9. The electronic device of claim 1, comprising seal rings in a triple or higher-order multiple configuration including the first and second seal rings.

10. The electronic device of claim 9, wherein the outermost seal ring of the plurality of seal rings has a planar shape with a winding in a portion corresponding to one side of the chip region.

11. The electronic device of claim 9, wherein the outermost seal ring of the plurality of seal rings has a planar shape with a projection extending to the opposite side of the chip region in a portion corresponding to one side of the chip region.

* * * * *